(12) United States Patent
Hogan et al.

(10) Patent No.: US 10,135,222 B2
(45) Date of Patent: Nov. 20, 2018

(54) VCSELS AND VCSEL ARRAYS DESIGNED FOR IMPROVED PERFORMANCE AS ILLUMINATION SOURCES AND SENSORS

(71) Applicant: Vixar, Plymouth, MN (US)

(72) Inventors: William Hogan, Minneapolis, MN (US); Mary Brenner, Plymouth, MN (US)

(73) Assignee: Vixar, Plymouth, MN (US)

( * ) Notice: Subject to any disclaimer, the term of this patent is extended or adjusted under 35 U.S.C. 154(b) by 0 days.

(21) Appl. No.: 15/167,168

(22) Filed: May 27, 2016

(65) Prior Publication Data

US 2016/0352071 A1 Dec. 1, 2016

Related U.S. Application Data

(60) Provisional application No. 62/167,396, filed on May 28, 2015.

(51) Int. Cl.
| | |
|---|---|
| *H01S 5/02* | (2006.01) |
| *H01S 5/022* | (2006.01) |
| *H01S 5/183* | (2006.01) |
| *H01S 5/42* | (2006.01) |
| *H04N 5/225* | (2006.01) |

(Continued)

(52) U.S. Cl.
CPC .......... *H01S 5/022* (2013.01); *H01S 5/02296* (2013.01); *H01S 5/1835* (2013.01); *H01S 5/18388* (2013.01); *H01L 2224/48091* (2013.01); *H01S 5/02212* (2013.01); *H01S 5/02276* (2013.01); *H01S 5/02292* (2013.01); *H01S 5/0653* (2013.01); *H01S 5/18394* (2013.01); *H01S 5/423* (2013.01); *H01S 2301/02* (2013.01); *H04N 5/2256* (2013.01); *H04N 5/33* (2013.01)

(58) Field of Classification Search
CPC .... H01S 5/022; H01S 5/02296; H01S 5/1835; H01S 5/18388; H01S 5/02212; H01S 5/02276; H01S 5/02292; H01S 5/423
See application file for complete search history.

(56) References Cited

U.S. PATENT DOCUMENTS

| | | |
|---|---|---|
| 5,266,794 A | 11/1993 | Olbright et al. |
| 5,707,139 A | 1/1998 | Haitz |

(Continued)

OTHER PUBLICATIONS

International Search Report and Written Opinion for related PCT Application No. PCT/US2016/034735 dated Oct. 14, 2016 (11 pages).

*Primary Examiner* — Armando Rodriguez
(74) *Attorney, Agent, or Firm* — Winthrop & Weinstine, P.A.

(57) ABSTRACT

A VCSEL package including a VCSEL, a housing, containing the VCSEL, and a diffuser operably attached to the housing and configured to receive an emitted beam of light from the VCSEL and produce a beam of predetermined angular divergence. The housing may be a PLLC package, a ceramic package, or a TO-style package. The diffuser could be a substantially planar diffuser sheet, which in some cases may be comprised of glass or plastic. In some embodiments, the diffuser could be a diffractive optical element or holographic light shaping diffuser. In some embodiments, the diffuser can be designed to produce a beam with an illumination full angle of up to about 90 degrees.

9 Claims, 21 Drawing Sheets

(51) Int. Cl.
*H04N 5/33* (2006.01)
*H01S 5/065* (2006.01)

(56) References Cited

U.S. PATENT DOCUMENTS

| | | | |
|---|---|---|---|
| 5,946,121 A * | 8/1999 | Jiang | H04B 10/114 |
| | | | 359/29 |
| 6,258,615 B1 | 7/2001 | Hou et al. | |
| 6,509,992 B1 * | 1/2003 | Goodwill | H04B 10/1141 |
| | | | 398/129 |
| 6,959,027 B1 | 10/2005 | Guilfoyle et al. | |
| RE41,738 E | 9/2010 | Brenner et al. | |
| 8,249,121 B2 | 8/2012 | Brenner et al. | |
| 8,494,018 B2 | 7/2013 | Brenner et al. | |
| 8,660,161 B2 | 2/2014 | Brenner et al. | |
| 8,989,230 B2 | 3/2015 | Dummer et al. | |
| 9,088,134 B2 | 7/2015 | Hibbs-Brenner et al. | |
| 2002/0185588 A1 | 12/2002 | Wagner et al. | |
| 2004/0028103 A1 | 2/2004 | Ueki | |
| 2004/0120151 A1 * | 6/2004 | Ostler | G01N 21/255 |
| | | | 362/294 |
| 2005/0169336 A1 | 8/2005 | Ishii et al. | |
| 2006/0083017 A1 * | 4/2006 | Wang | B64F 1/20 |
| | | | 362/547 |
| 2007/0217472 A1 | 9/2007 | Collins et al. | |
| 2008/0170392 A1 * | 7/2008 | Speier | F21V 7/0008 |
| | | | 362/227 |
| 2009/0010297 A1 | 1/2009 | Uchida | |
| 2012/0281293 A1 | 11/2012 | Gronenborn et al. | |
| 2013/0034117 A1 | 2/2013 | Hibbs-Brenner et al. | |
| 2013/0223466 A1 | 8/2013 | Gronenborn et al. | |
| 2013/0266326 A1 | 10/2013 | Joseph et al. | |
| 2014/0071406 A1 | 3/2014 | Manni et al. | |
| 2014/0079088 A1 | 3/2014 | Joseph | |
| 2015/0034975 A1 * | 2/2015 | Rudmann | H01L 27/14625 |
| | | | 257/82 |
| 2015/0108353 A1 * | 4/2015 | Geiger | G01D 5/34707 |
| | | | 250/341.8 |
| 2015/0229912 A1 * | 8/2015 | Masalkar | G01S 7/481 |
| | | | 348/46 |
| 2015/0380901 A1 | 12/2015 | Brenner et al. | |
| 2017/0207374 A1 * | 7/2017 | Gubser | H01L 33/56 |

* cited by examiner

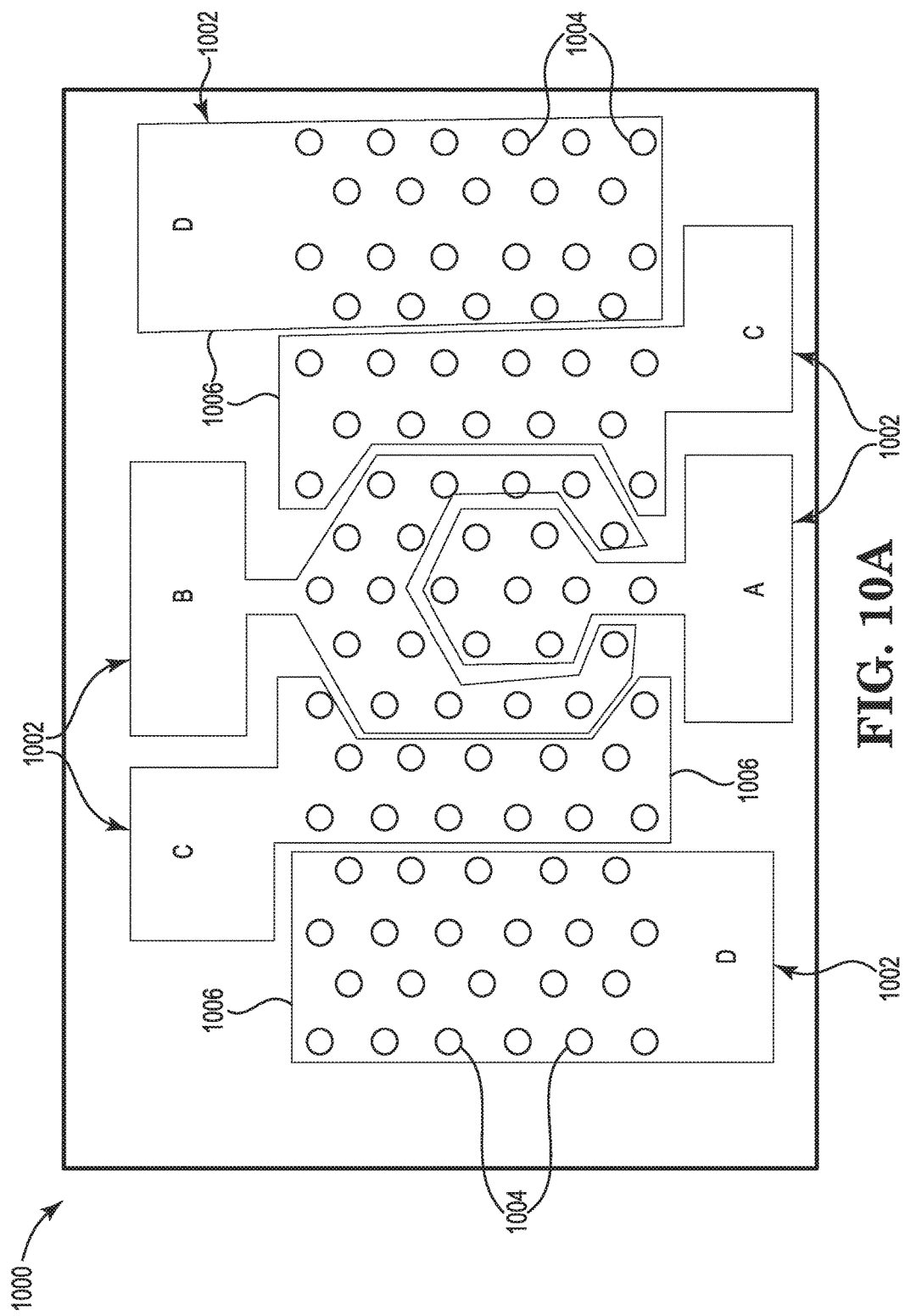

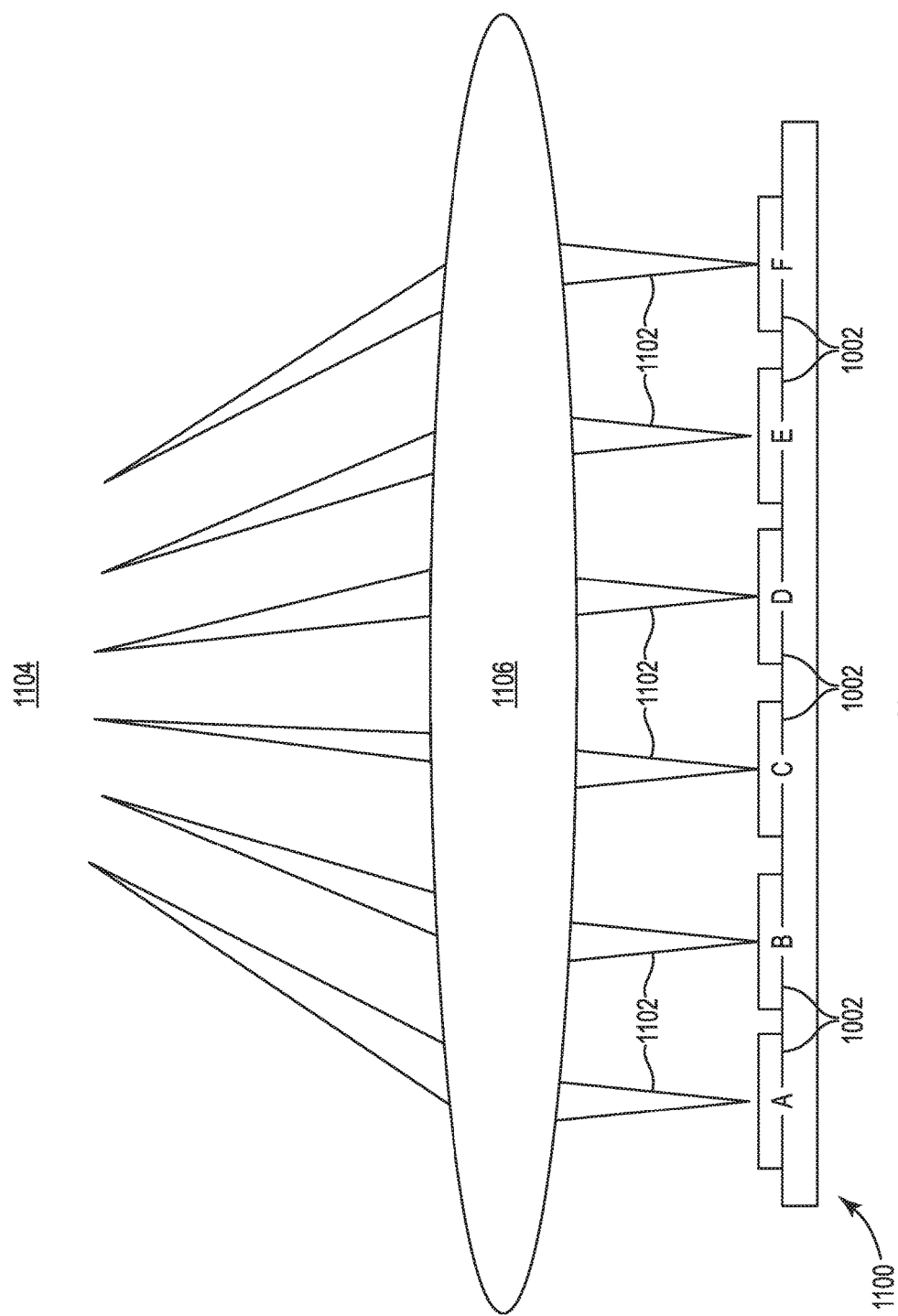

VCSELS AND VCSEL ARRAYS DESIGNED FOR IMPROVED PERFORMANCE AS ILLUMINATION SOURCES AND SENSORS

CROSS-REFERENCE TO RELATED APPLICATIONS

This application claims the benefit of U.S. Prov. Pat. Appl. No. 62/167,396, titled "VCSEL Arrays with Improved Performance," filed May 28, 2015, the contents of which are hereby incorporated by reference herein in their entirety.

FIELD OF THE INVENTION

The present disclosure relates to vertical-cavity surface-emitting lasers (VCSELs) and VCSEL arrays. Particularly, the present disclosure relates to VCSELs and VCSEL arrays having improved performance.

BACKGROUND OF THE INVENTION

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

VCSELs, and particularly VCSEL arrays, emitting in the range of 50 mW to 10 W of optical power are important technology for applications within a variety of markets, including but not limited to, the consumer, industrial, automotive, and medical industries. Example applications include, but are not limited to, illumination for security cameras, illumination for sensors such as three-dimensional (3D) cameras or gesture recognition systems, medical imaging systems, light therapy systems, or medical sensing systems such as those requiring deep penetration into tissue. In such optical sensing and illumination applications as well as other applications, VCSELs and VCSEL arrays offer several benefits, as will be described in further detail herein, including but not limited to, power efficiency, narrow spectral width, narrow beam divergence, and significant packaging flexibility.

Indeed, for VCSELs and VCSEL arrays, power conversion efficiency (PCE) of greater than 40% can be achieved at wavelengths in at least the 800-1000 nm range. PCE may be defined as the ratio of optical power emitted from a laser(s), such as a VCSEL or VCSEL array, divided by the electrical power used to drive the laser(s). While VCSEL PCE, alone, is fairly comparable to that for some of the most efficient light-emitting diodes (LEDs) currently available, when spectral width and beam divergence are considered, there are significant efficiency benefits to VCSELs over LEDs.

For example, VCSEL arrays generally have a spectral width of approximately 1 nm. This allows the use of filters for a photodetector or camera in order to reduce the noise associated with background radiation. For comparison, a LED typically has a spectral linewidth of 20-50 nm, resulting in the rejection of much of the light by such a filter, and hence reducing the effective PCE of the LED. In addition, the wavelength of a VCSEL is less sensitive to temperature, increasing only around 0.06 nm per 1° Celsius. The VCSEL rate of wavelength shift with temperature is four times less than in a LED.

Also for example, the angular beam divergence of a VCSEL is typically 10-30 degrees full width half maximum (FWHM), whereas the output beam of a LED is Lambertian, filling the full hemisphere. This means that generally all, if not all, of the light of a VCSEL can be collected using various optical elements, such as lenses for a collimated or focused beam profile, diffusers for a wide beam (40-90 degrees or more) profile, or a diffractive optical element to generate a pattern of spots or lines. Due to the wide beam angle of a LED, it can be difficult to collect all or nearly all of the light (leading to further degradation of the PCE), and also difficult to direct the light as precisely as is possible with a VCSEL.

The vertically emitting nature of a VCSEL also gives it much more packaging flexibility than a conventional laser, and opens up the door to the use of the wide range of packages available for LEDs or semiconductor integrated circuits (ICs). In addition to integrating multiple VCSELs on the same chip, as will be described in further detail below, one can package VCSELs or VCSEL arrays with photodetectors or optical elements. Plastic or ceramic surface mount packaging or chip-on-board options are also available to the VCSEL.

VCSEL geometry traditionally limits the amount of optical power a VCSEL can provide. To illustrate the issue, FIG. 1 is a diagram of the cross-section of a typical VCSEL 100, and includes general structural elements and components that may be utilized, as an example, for VCSEL and VCSEL array embodiments disclosed herein. In general, epitaxial layers of a VCSEL may typically be formed on a substrate material 102, such as a GaAs substrate. On the substrate 102, single crystal quarter wavelength thick semiconductor layers may be grown to form mirrors (e.g., n- and p-distributed Bragg reflectors (DBRs)) around a quantum well based active region to create a laser cavity in the vertical direction. For example, on the substrate 102, first mirror layers 104 may be grown, such as but not limited to layers forming an AlGaAs n-DBR. A spacer 106, such as but not limited to an AlGaAs or AlGaInP spacer, may be formed over the first mirror layers 104. Then a quantum well based active region 108, such as but not limited to an AlGaInP/GaInP or GaAs/AlGaAs multiple quantum well (MQW) active region, may be formed, along with another spacer layer 110, such as but not limited to an AlGaAs or AlGaInP spacer. Over that, second mirror layers 112 may be grown, such as but not limited to layers forming an AlGaAs p-DBR, over which a current spreader/cap layer 114 may be formed, such as but not limited to, an AlGaAs/GaAs current spreader/cap layer. A contacting metal layer 116 may be formed over the cap layer 114, leaving an aperture of desired diameter generally centered over the axis of the VCSEL. In some embodiments, a dielectric cap 120 may be formed within the aperture 118. As will be explained in more detail below with specific reference to certain embodiments of the present disclosure, a mesa 122 may be formed by etching down the epitaxial structure of the VCSEL to expose a higher aluminum containing layer or layers 124 for oxidation. The oxidation process leaves an electrically conductive aperture 126 in the oxidized layer or layers that is generally aligned with the aperture 118 defined by the contacting metal layer 116, providing confinement of current to the middle of the VCSEL 100. More specific details regarding VCSEL structure and fabrication as well as additional VCSEL embodiments and methods for making and using VCSELs are disclosed, for example, in: U.S. Pat. No. 8,249,121, titled "Push-Pull Modulated Coupled Vertical-Cavity Surface-Emitting Lasers and Method;" U.S. Pat. No. 8,494,018, titled "Direct Modulated Modified Vertical-Cavity Surface-Emitting Lasers and Method;" U.S. Pat. No. 8,660,161, titled "Push-Pull Modulated Coupled Vertical-Cavity Surface-Emitting Lasers and Method;" U.S. Pat. No. 8,989,230, titled "Method and Apparatus Including Movable-Mirror MEMS-Tuned Surface-Emitting Lasers;" U.S. Pat. No. 9,088,134, titled "Method and Apparatus Including Improved Vertical-Cavity Surface-Emitting Lasers;" U.S. Reissue Pat. No. RE41,738, titled "Red Light Laser;" and U.S. Publ. No. 2015/0380901, titled "Method and Apparatus Including Improved Vertical-Cavity Surface-Emitting Lasers;" of which the contents of each are hereby incorporated by reference herein in their entirety. Without being limited to solely the VCSELs described in any one of the foregoing patents or patent applications, VCSELs suitable for various embodiments of the present disclosure or suitably modifiable according to the present disclosure include the VCSELs disclosed in the foregoing patents or patent applications, including any discussion of prior art VCSELs therein, as well as VCSELs disclosed in any of the prior art references cited during examination of any of the foregoing patents or patent applications. More generally, unless specifically or expressly described otherwise, any VCSEL now known or later developed may be suitable for various embodiments of the present disclosure or suitably modifiable according to the present disclosure.

For efficient operation of a VCSEL, a method for providing current confinement in the lateral direction (achieved with the electrically insulating oxidation layer shown) to force current flow through the center of the device is often required. The metal contact 116 on the surface of the device may provide a means for injecting current into the VCSEL. As described above, the metal contact 116 should have an opening or aperture 118 in order to allow the light to leave the VCSEL. There is a limit to how far current can be spread efficiently across this aperture, and hence there is a limit to the lateral extent of the laser, and in turn, the maximum power that can be emitted from a single aperture. A solution to this, for applications requiring more power, is to create multiple VCSELs on a chip that operate together in parallel. In such an approach, the total output power can be scaled simply by scaling the number of VCSEL devices or apertures. FIG. 2 illustrates an example layout for a VCSEL die or chip 200 with, for example, one hundred eleven (111) VCSEL devices/apertures 202. A common metal layer 204 on the top surface of the chip 200 (or similar contact mechanism) may contact the anode of each VCSEL device 202 simultaneously, and a common cathode contact (or similar contact mechanism) may be made on the backside of the chip, allowing all the VCSEL devices to be driven in parallel.

An array approach not only solves the technical issue of emitting more optical power, but also provides important advantages. For example, a conventional single coherent laser source results in speckle, which adds noise. However, as will be explained in more detail below with respect to embodiments of the present disclosure, speckle contrast can be reduced through the use of an array of lasers which are mutually incoherent with each other.

Another advantage or benefit is that of improved eye safety. An extended source is generally more eye safe than a point source emitting the same amount of power. Still another advantage or benefit is the ability to better manage thermal heat dissipation by spreading the emission area over a larger substrate area.

Requirements for an optical source typically depend upon the application and the sensing mechanism used. For example, illumination for night vision cameras may involve simply turning on the light source to form constant uniform illumination over a wide angle which is reflected back to the camera. However, additional illumination schemes can provide more information, including but not limited to, three-dimensional (3D) information. FIGS. 3A-C illustrate example sensing mechanisms—structured lighting, time-of-flight, and modulated phase shift—used to gather information in three dimensions. As illustrated in FIG. 3A, in structured lighting, a pattern (e.g., dots, lines, more complex patterns, etc.) 302 may be imposed upon the light source 304, and then one or more cameras 306 are used to detect distortion in the structure of the light to estimate distance. As conceptually illustrated in FIG. 3B, in a time-of-flight approach, a time-gated camera may be used to measure the roundtrip flight time of a light pulse. As graphically illustrated in FIG. 3C, in the case of modulated phase shift, an amplitude modulation may be imposed upon the emitted light, and the phase shift between the emitted beam and reflected beam may be recorded and used to estimate the distance traveled.

Typically, requirements of an optical light source for any given application may include consideration of one or more of the following:

1. Optical output power: Sufficient power is required for illumination of the area of interest. This can range from tens of milliwatts optical power, such as for a sensing range of a generally a few centimeters, to hundreds of milliwatts, such as for games or sensing of generally a meter or two or so, to ten watts, such as for collision avoidance systems, and kilowatts of total power, such as for a self-driving car.

2. Power efficiency: Particularly for mobile consumer devices, a high efficiency in converting electrical to optical power is desirable and advantageous.

3. Wavelength: For many applications, including most consumer, security, and automotive applications, it may be preferable that the illumination be unobtrusive to the human eye, and often in the infrared region. On the other hand, low cost silicon photodetectors or cameras limit the wavelength on the long end of the spectrum. For such applications, a desirable range therefore, may be generally around or between 800-900 nm. However, some industrial applications may prefer a visible source for the purpose of aligning a sensor, and some medical applications may rely on absorption spectra of tissue, or materials with sensitivity in the visible regime, primarily around 650-700 nm.

4. Spectral width and stability: The presence of background radiation, such as sunlight, can degrade the signal-to-noise ratio of a sensor or camera. This can be compensated with a spectral filter on the detector or camera, but implementing this without a loss of efficiency often requires a light source with a narrow and stable spectrum.

5. Modulation rate or pulse width: For sensors based, for example, upon time of flight or a modulation phase shift, the achievable pulse width or modulation rate of the optical source can determine the spatial resolution in the third dimension.

6. Beam divergence: A wide variety of beam divergences might be specified, depending upon whether the sensor is targeting a particular spot or direction, or a relatively larger area.

7. Packaging: The package provides the electrical and optical interface to the optical source. It may incorporate an optical element that helps to control the beam profile, and may generate a structured lighting pattern. Particularly for mobile devices or other small devices, the overall packaging would desirably be as compact as possible.

In view of the foregoing, there is a need in the art for VCSELs or VCSEL arrays, or configurations thereof, that enhance performance or functionality for use, for a non-limiting example, as illumination sources for cameras and sensors.

BRIEF SUMMARY OF THE INVENTION

The following presents a simplified summary of one or more embodiments of the present disclosure in order to provide a basic understanding of such embodiments. This summary is not an extensive overview of all contemplated embodiments, and is intended to neither identify key or critical elements of all embodiments, nor delineate the scope of any or all embodiments.

The present disclosure, in one embodiment, relates to a VCSEL package including a VCSEL, a housing, containing the VCSEL, and a diffuser operably attached to the housing and configured to receive an emitted beam of light from the VCSEL and produce a beam of predetermined angular divergence. The housing may be a Plastic Leaded Chip Carrier package, a ceramic package, or a TO-style package. The diffuser could be a substantially planar diffuser sheet, which in some cases may be comprised of glass or plastic. In some embodiments, the diffuser could be a diffractive optical element or holographic light shaping diffuser. In some embodiments, the diffuser can be designed to produce a beam with an illumination full angle of up to about 90 degrees.

The present disclosure, in another embodiment, relates to a VCSEL and diffuser combination including a VCSEL mounted to a circuit board, a spacer positioned at least partially around the VCSEL, and a diffuser operably attached to the spacer and configured to receive an emitted beam of light from the VCSEL and produce a beam of predetermined angular divergence. The diffuser may be a glass or plastic substantially planar diffuser sheet. In some embodiments, the diffuser could be a diffractive optical element or holographic light shaping diffuser. In some embodiments, the diffuser can be designed to produce a beam with an illumination full angle of up to about 90 degrees.

The present disclosure, in yet another embodiment, relates to an electronic device with an illumination source. The device may include a VCSEL mounted within the electronic device and behind a window panel of the electronic device, wherein the window panel includes a diffuser configured to receive an emitted beam of light from the VCSEL and produce a beam of predetermined angular divergence. In some embodiments, the window panel may include an optical element comprising a light spreading diffuser and a directional beam turning film to redirect the beam of light emitted from the VCSEL. In some embodiments, the window panel may be shaped, such as like a prism, to redirect the beam of light emitted from the VCSEL. While not limited to such, the electronic device could be a camera and the VCSEL could be designed to emit infrared illumination. In some embodiments, the diffuser may be a glass or plastic substantially planar diffuser sheet. In some embodiments, the diffuser may be a diffractive optical element or holographic light shaping diffuser. The diffuser can be designed to produce a beam with an illumination full angle of up to about 90 degrees.

While multiple embodiments are disclosed, still other embodiments of the present disclosure will become apparent to those skilled in the art from the following detailed description, which shows and describes illustrative embodiments of the invention. As will be realized, the various embodiments of the present disclosure are capable of modifications in various obvious aspects, all without departing from the spirit and scope of the present disclosure. Accordingly, the drawings and detailed description are to be regarded as illustrative in nature and not restrictive.

BRIEF DESCRIPTION OF THE DRAWINGS

While the specification concludes with claims particularly pointing out and distinctly claiming the subject matter that is regarded as forming the various embodiments of the present disclosure, it is believed that the invention will be better understood from the following description taken in conjunction with the accompanying Figures, in which:

FIG. 10A is a schematic of a segmented VCSEL array, according to one embodiment of the present disclosure.

FIG. 11B is a schematic of a segmented VCSEL array in combination with a lens or other optical element, according to one embodiment of the present disclosure.

DETAILED DESCRIPTION

The present disclosure relates to novel and advantageous VCSELs and VCSEL arrays. Particularly, the present disclosure relates to VCSELs and VCSEL arrays having performance or functionality for use, for a non-limiting example, as illumination sources for cameras and sensors.

Design and Packaging to Improve Spectrum and Beam Angle

One embodiment of the present disclosure relates to a design and packaging approach for improving, or even optimizing, spectrum and beam angle of an illumination source. Illumination sources are often required for cameras and optical sensors. The preferred angular dispersion of the illumination source generally depends upon the application, but in many cases it might be preferable to cover a large area, with an angle of up to 90 degrees or more. LEDs can generally provide this capability. However, to eliminate noise due to background light, such as sunlight, it can be advantageous to include an optical filter in front of the detector or camera. Such a filter may be designed to allow light through at the wavelength of the illumination source, while eliminating light or precluding the pass through of light at other wavelengths. Generally, the narrower the spectral bandwidth of the filter, the better the signal-to-noise ratio that can be achieved. In that case, a narrow linewidth optical source, such as a laser, can provide the narrow linewidth source that will pass through the filter with little to no loss.

Figure 4A:
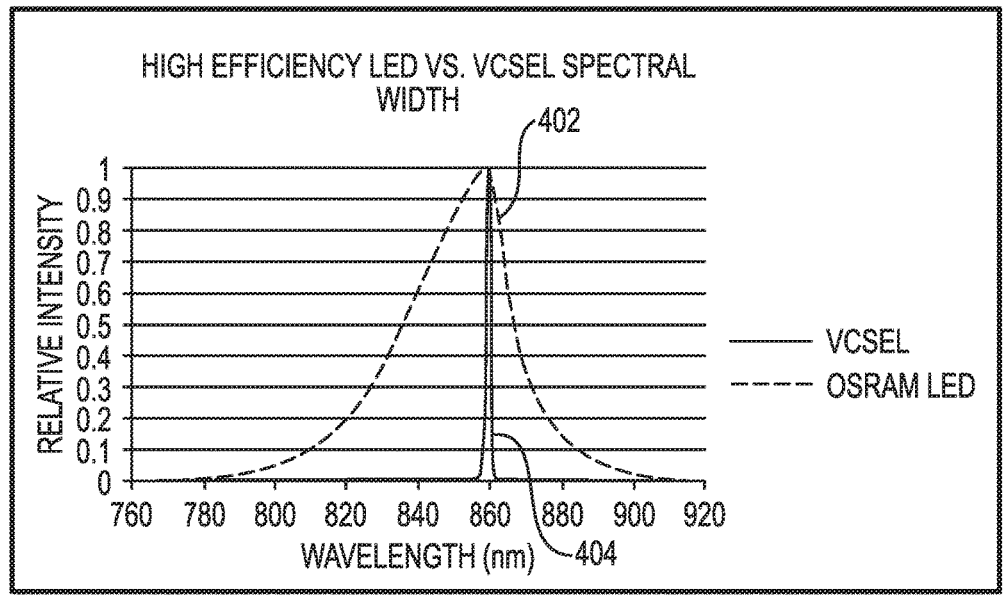
FIG. 4A is a graph comparing the spectra of a conventional high efficiency LED and a VCSEL.

FIG. 4A demonstrates a comparison of the spectra of a conventional high efficiency LED 402 and a VCSEL 404. The spectral width of the VCSEL is generally less than 1 nm, while the FWHM linewidth of the light emitted from the LED is about 30 nm, and the spectral width for light emitted from the LED with greater than 10% of the maximum is around 70 nm.

Figure 4B:
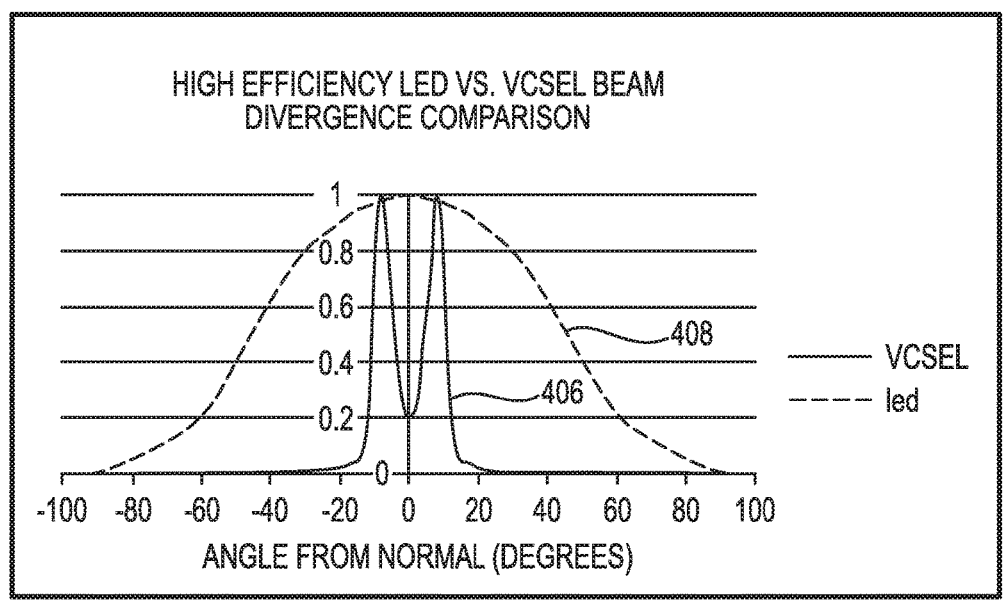
FIG. 4B is a graph comparing the beam divergence of a multi-mode VCSEL to a conventional high efficiency LED.

FIG. 4B demonstrates the beam divergence of a multi-mode VCSEL 406 compared to that of the conventional high efficiency LED 408 used for the comparison in FIG. 4A (i.e., normalized intensity versus the angle from the normal direction). Most of the light from the VCSEL is emitted within an angle of +/−10 degrees, while the LED light generally extends over a full hemisphere.

Figure 5:
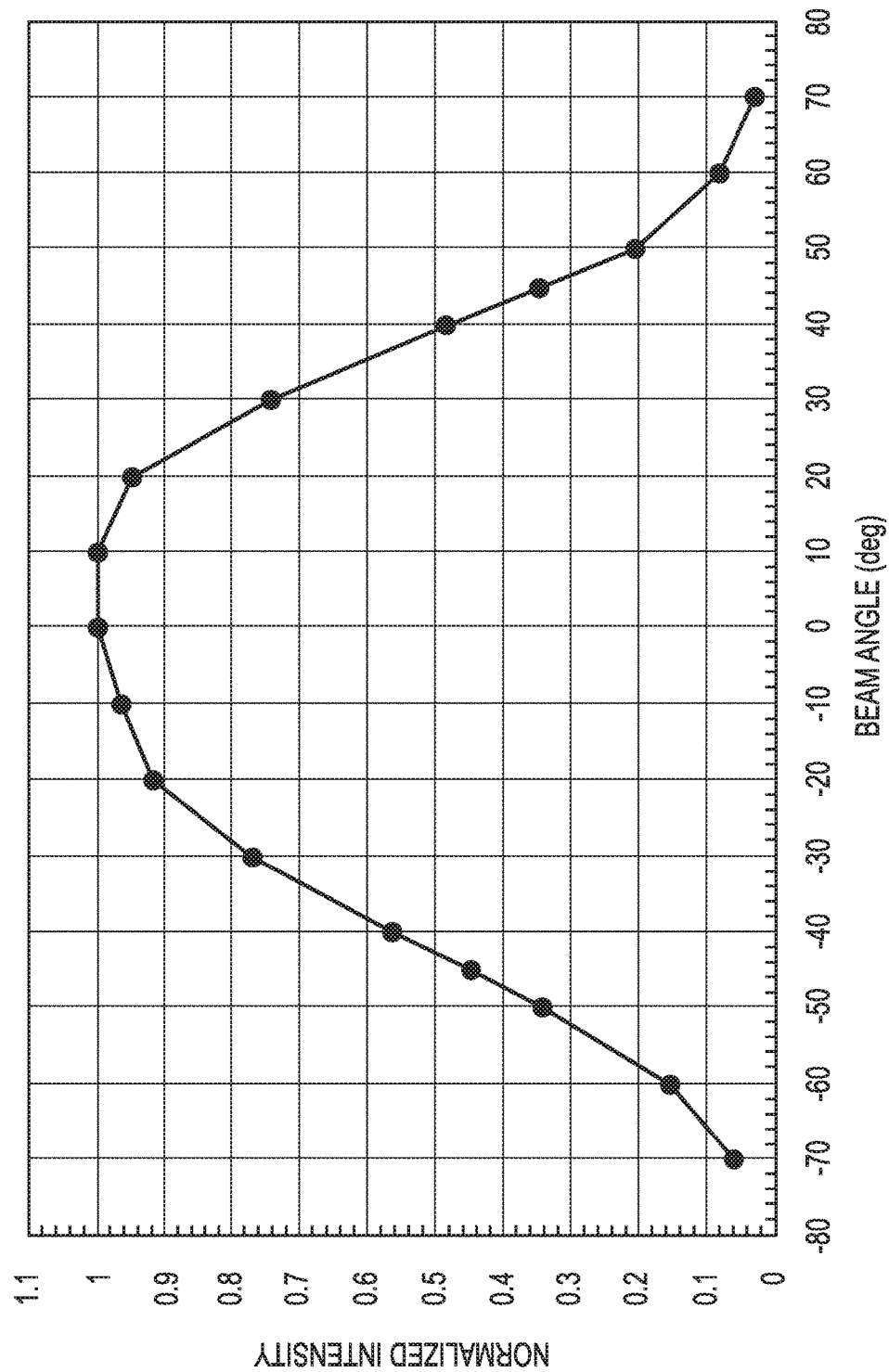
FIG. 5 is a graph of the beam profile of the VCSEL having the beam profile illustrated in FIG. 4B combined with a holographic diffuser designed to provide an illumination full angle of 90 degrees.

It would be desirable, however, to combine some of the best aspects of LEDs with some of the best aspects of VCSELs for many illumination applications. According to embodiments of the present disclosure, this can be done by combining a VCSEL with a diffuser. The diffuser could be made of any suitable material, and could be, for example but not limited to, a ground glass diffuser. However, better control over angle is generally provided by diffractive optical elements or holographic light shaping diffusers, where the beam profile can be controlled to provide a specific angular range. For example, FIG. 5 illustrates the beam profile when a VCSEL with the beam profile illustrated in FIG. 4B is combined with a holographic diffuser designed to provide an illumination full angle of 90 degrees. The emitted light from the VCSEL is spread out in angle, and is also homogenized so that the intensity is highest in the normal direction and drops off gradually with increasing angle. This profile approximates that of a conventional LED. However, this beam profile is achieved without broadening the spectral width of the VCSEL.

Figure 6A:
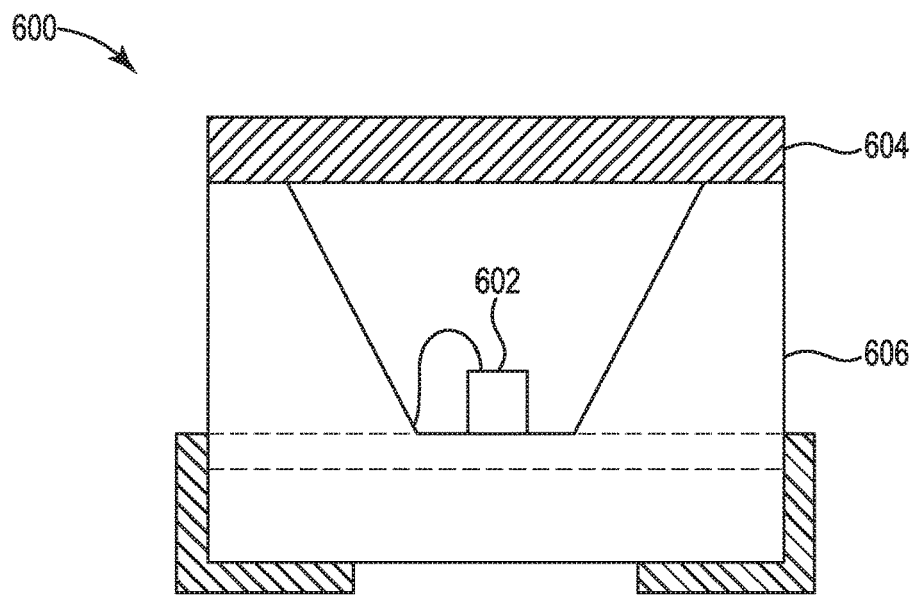
FIG. 6A is a schematic of a packaging approach to achieve integration of a VCSEL with a diffuser, according to one embodiment of the present disclosure.
Figure 6B:
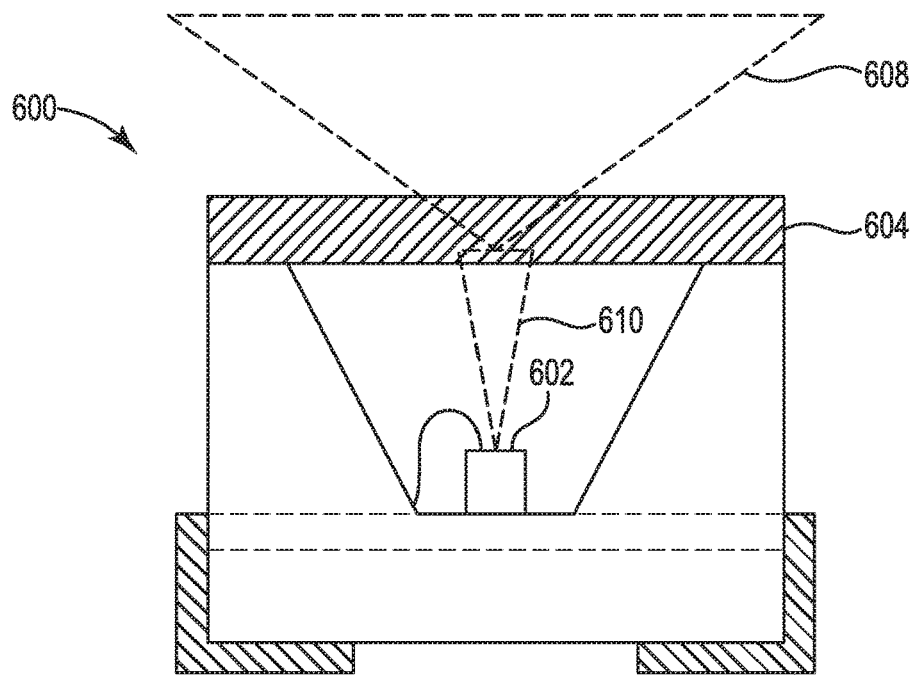
FIG. 6B is a schematic illustrating the effect of a diffuser in the packaging approach of FIG. 6A.

FIG. 6A illustrates one embodiment of a packaging approach 600 to achieve integration of a VCSEL 602 with a diffuser 604. In one embodiment, a Plastic Leaded Chip Carrier (PLCC) package 606, which allows for surface mount attachment to a circuit board, may hold or contain a VCSEL die 602. With PLCC packages, normally an encapsulant is injected into the well thereof in order to protect the elements therein. According to an embodiment of the present disclosure illustrated schematically in FIG. 6A, however, a planar sheet of a glass or plastic diffuser 604, or other planar diffuser of suitable material, may be attached, bonded, mounted, coupled to, or otherwise positioned at or near the top surface of the PLCC package 606, such as with an epoxy or other bonding/attachment means or method. FIG. 6B schematically illustrates the general effect 608 of a diffuser 604 positioned in this manner on the PLCC package 606. As can be seen in the schematic of FIG. 6B, the relatively narrow beam divergence 610 (around 10-20 degrees) of the VCSEL 602 can be expanded 608 once it hits the diffuser 604. Of course, the actual effect of the diffuser (e.g., the angle of the expanded beam/amount of diffusion) will generally depend on the material, characteristics, and design of the diffuser. Such an approach, according to the present disclosure, permits relatively simple assembly. Moreover, this same approach can be applied to a variety of package types. For instance, a planar sheet of diffuser of any suitable material can also be attached, bonded, mounted, coupled to, or otherwise positioned at or near the top surface of a ceramic package, or to the lid of a TO-style package. In the case of chip-on-board packaging, a spacer can be used and positioned at least partially around the VCSEL die, and a planar sheet of diffuser of any suitable material, size, and shape can be attached, bonded, mounted, coupled to, or otherwise positioned at or near the top surface of the spacer.

Figure 7A:
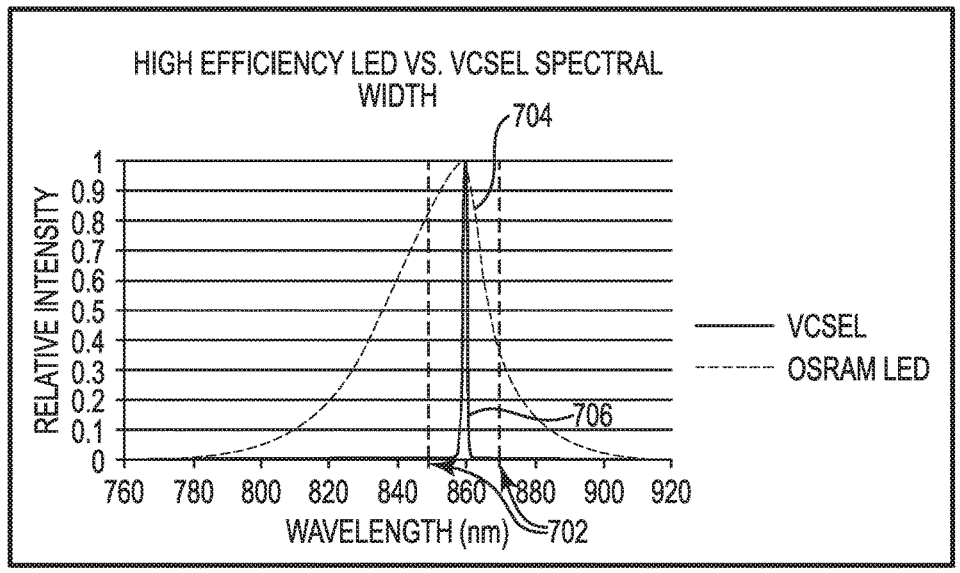
FIG. 7A is a graph illustrating the limits of a spectral filter of +/−10 nm width superimposed on the spectra of a LED and VCSEL of FIG. 4A.
Figure 7B:
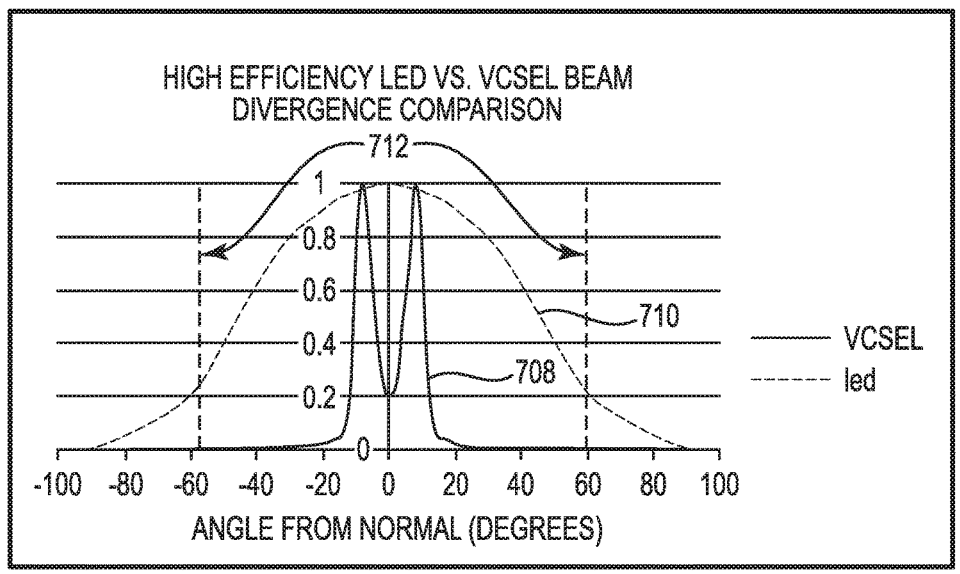
FIG. 7B is a graph superimposing an estimated collection angle on the beam divergence of a VCSEL and LED of FIG. 4B.

FIGS. 7A-B further demonstrate how the characteristics of a LED and a VCSEL can affect their efficiency, in use. FIG. 7A illustrates the limits of an example spectral filter of +/−10 nm width 702 superimposed on the spectral profile of a LED 704 and VCSEL 706 referenced in FIG. 4A, and centered around the peak wavelengths of the LED and VCSEL. FIG. 7B illustrates, superimposed on the angular beam profile of a VCSEL 708 and LED 710 referenced in FIG. 4B, a 60 degree angle corresponding to an estimated collection angle 712 beyond which any emitted light would likely be shadowed by a package or that would likely no longer be efficiently collected by a lens. As can be seen from FIG. 7A, substantially all, if not all, of the VCSEL light would pass through a filter 702 centered at, for example, 860 nm or whatever wavelength the VCSEL might otherwise be designed for, within a spectral width of +/−10 nm, while a high proportion of the LED light (designed with the same or about the same peak wavelength as the VCSEL) would be rejected. As can be seen from FIG. 7B, essentially all of the VCSEL light is within the estimated collection angle 712, while about 15% of the LED light would likely not be collected by a lens or even escape a package.

Based upon the demonstrated spectral width of a high efficiency LED (see FIG. 7A), and assuming a +/−10 nm spectral filter width centered at the peak wavelength of the LED, approximately 80% of the emitted LED light would be rejected by the filter. Of course, the percentage of LED light rejected by a filter scales with the spectral bandwidth of the filter. As a result of the foregoing, although the presently reported best power conversion efficiencies (% of electrical power converted to optical power) of LEDs and VCSELs are similar, in the circumstances shown above, the effective efficiency of the VCSEL for certain applications will significantly exceed that of the LED.

Figure 8A:
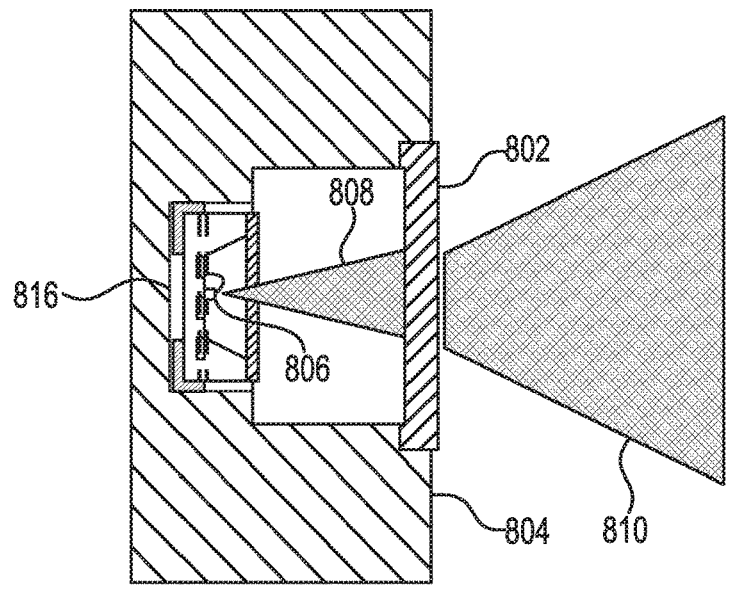
FIG. 8A is a schematic illustration of a diffuser incorporated in, or replacing, the window covering or enclosing a camera or illumination source on, for example, a mobile consumer device.

In some cases, such as but not limited to, a camera with infrared (IR) illumination, a packaged VCSEL may be positioned inside a device (e.g., a mobile phone or tablet device or the like), with the light emitted through a window on the exterior of the device. In such case, adding a diffuser to the VCSEL package, as described above, might be counter-productive. The larger angle of the light emerging from such a diffusing VCSEL package could ultimately be subject to the same losses as a LED due to blocking by the internal structure(s) of the device behind the window, for instance. FIG. 8A is a conceptual version of one solution, where a diffuser 802 is placed or incorporated in, or replaces, the window of the device 804. As shown schematically in FIG. 8A, the VCSEL 806 or VCSEL package 816 may be located some distance below or back from the diffuser window 802 of the device 804, mounted, for example, on a circuit board within the device. The narrow angle of light 808 emitted by the VCSEL 806 may reach the diffuser window 802, and the diffuser (replacing or incorporated into the window) may be designed to expand 810 the angle of the emitted light.

If, on the one hand, this were a LED (or in even some cases, the above-described VCSEL with a diffuser already attached to a package (see FIGS. 6A-B)), then a significant amount of light would likely be lost, since the beam divergence would likely be too wide that some of the emitted light won't even impinge on the window of the device. The light missing the window would reflect off other surfaces inside the device and eventually be absorbed somewhere within the device.

If, however, a diffuser is incorporated within the window or otherwise the window is replaced with a diffuser, substantially all, if not all, of the VCSEL light may be collected at the diffuser, and the diffuser can be used to generally homogenize and spread out the light as it exits the device. In a typical scenario, a VCSEL beam divergence of approximately 20 degrees full angle would mean that the diameter of the VCSEL beam at the window will typically be less than half of the distance from the VCSEL to the window. In one embodiment, the diffuser 802 that replaces, or is incorporated in, the window of the device could be made of any suitable material, and could be, for example but not limited to, a ground glass diffuser. However, better control over angle is generally provided by diffractive optical elements or holographic light shaping diffusers, where the beam profile can be controlled to provide a specific beam divergence. These diffuser mechanisms typically come as molded pieces or as sheets that can be cut to size and may be used in place of the window itself.

Figure 8B:
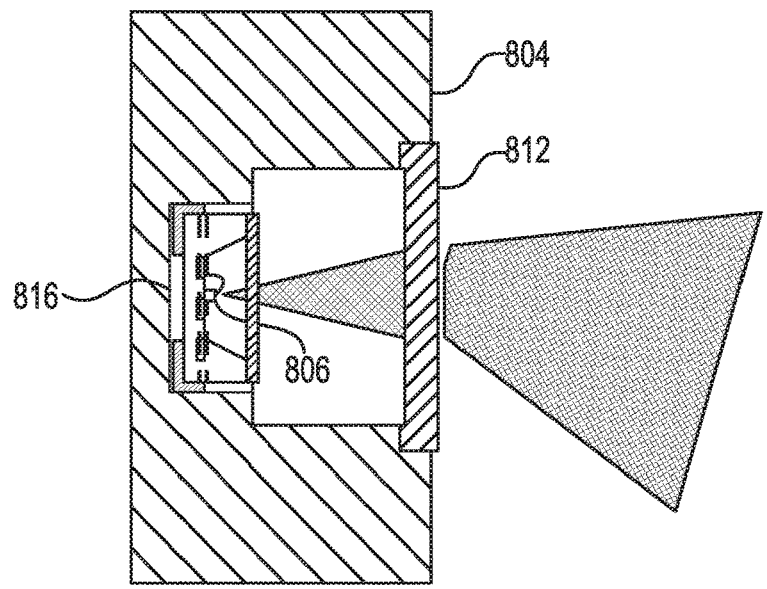
FIG. 8B is a schematic illustration of a diffuser and direction turning film incorporated in, or replacing, the window covering or enclosing a camera or illumination source on, for example, a mobile consumer device.
Figure 8C:
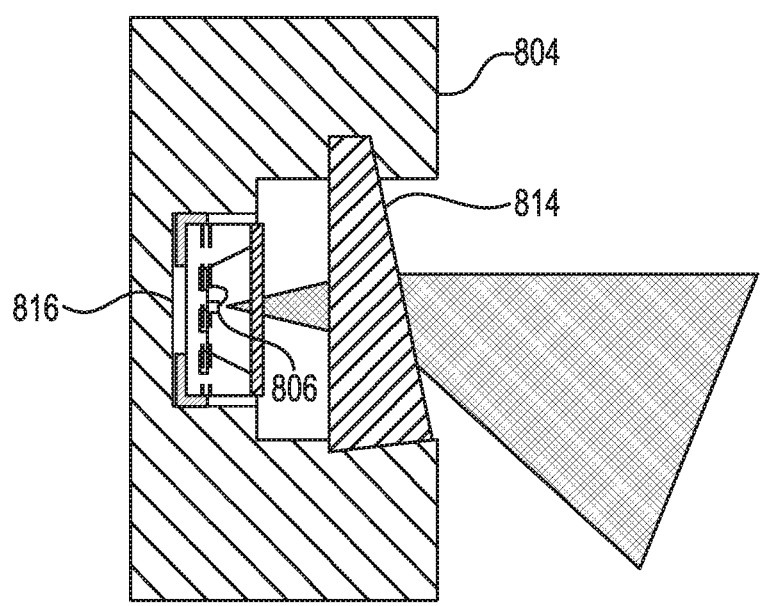
FIG. 8C is a schematic illustration of a window covering or enclosing a camera or illumination source on that generally takes the shape of a prism.

In addition to the foregoing, as schematically illustrated in FIG. 8B, if it is desirable for a given application to tilt or redirect the beam as it exits the window of the device 804, a direction turning film that incorporates, for example, microprisms may be utilized to tilt or redirect the beam. A direction turning film can come as a molded piece or as a larger film that can be cut to size. In one embodiment, the diffuser and the direction turning film can be incorporated into or combined as the same sheet (i.e., 812 in FIG. 8B), if desired, so that both functions can be achieved at the same time. However, it is not required that the diffuser and the direction turning film be incorporated into the same sheet. In still a further embodiment, the window of the device itself (or a diffuser replacing the window) 814 may generally take the shape of a prism or other beam bending shape, as schematically illustrated in FIG. 8C.

Although not limited to the following, unique features of the foregoing embodiments of the present disclosure include: combining a VCSEL with a diffuser to produce a beam with a narrow spectral width and a controllable angular divergence; a packaging approach comprising combining a VCSEL with a diffuser by attaching, bonding, mounting, coupling, or otherwise positioning it at or near the top surface of a package, such as a PLCC, ceramic package, or TO-style package; a packaging approach comprising combining a VCSEL with a diffuser in a chip-on-board configuration, by adding a spacer around the VCSEL and attaching the diffuser to the top of the spacer; mounting a VCSEL die or VCSEL package on a circuit board inside a camera or other device using IR illumination, and incorporating a diffuser into the window of the camera or other device or replacing the window of the camera or other device with a diffuser cut or molded to fit the window space; mounting a VCSEL die or VCSEL package on a circuit board inside a camera or other device using IR illumination, and incorporating an optical element combining a light spreading diffuser and directional turning film into the window of the camera or other device or replacing the window of the camera or other device with such an optical element; mounting a VCSEL die or VCSEL package on a circuit board inside a camera or other device using IR illumination, and positioning a prism-shaped window having a diffuser on at least one surface, such that the window both turns the direction of the light, and expands the angle of the light emitted from the VCSEL die or VCSEL package.

Design of Array to Dynamically Control Power and Beam Direction

Figure 9A:
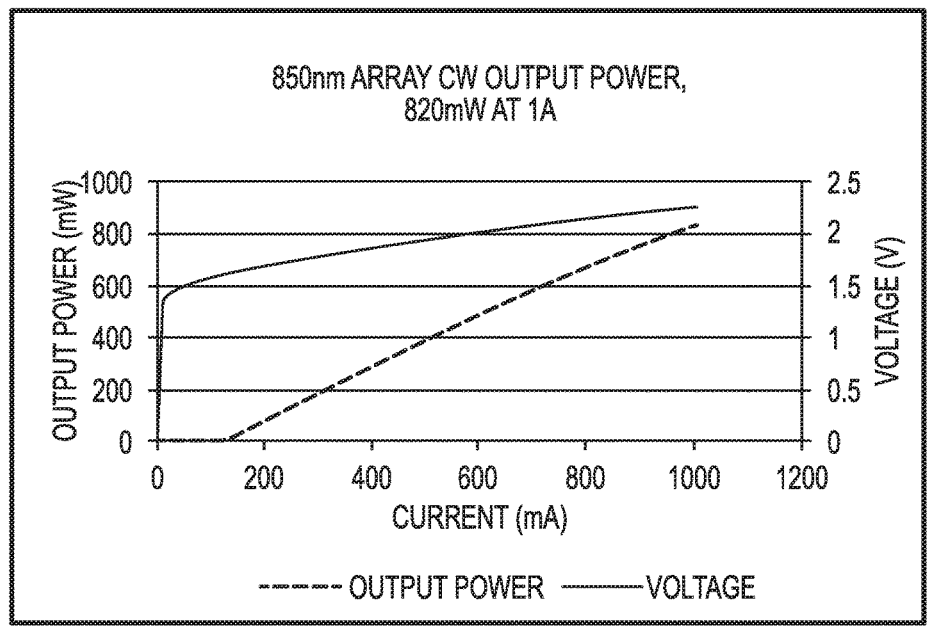
FIG. 9A is a graph of the output power and voltage versus drive current for a 850 nm VCSEL array.
Figure 9B:
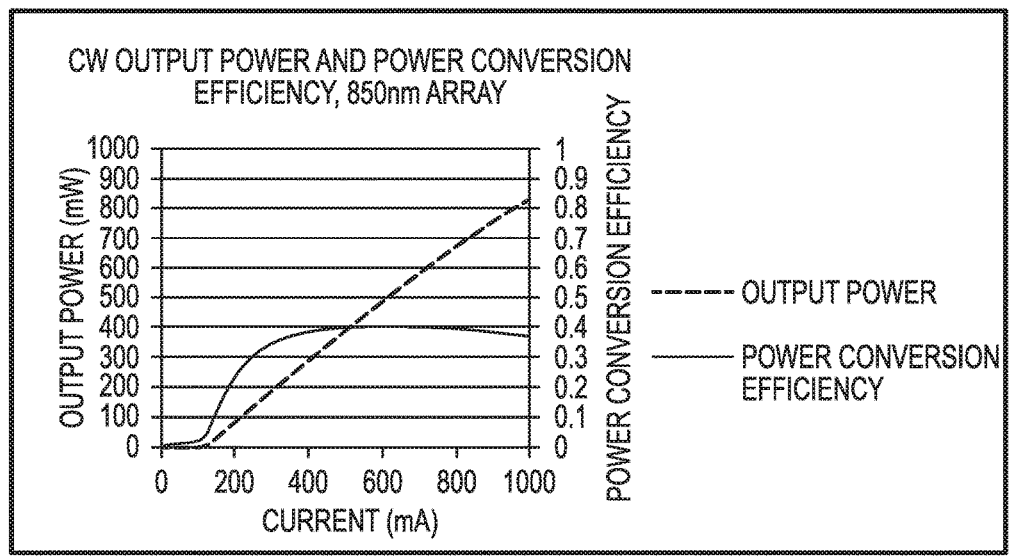
FIG. 9B is a graph of the output power and PCE versus drive current for a 850 nm VCSEL array.

Another challenge in designing a VCSEL array for illumination or for a sensor is the ability to scale the output power of the device while maintaining high efficiency. FIGS. 9A-B illustrate output power, voltage, and PCE versus drive current for a 850 nm VCSEL array. For the purposes of FIGS. 9A-B, an example VCSEL array having fifty-one (51) individual VCSELs was used. As may be appreciated from FIGS. 9A-B, the PCE remains generally at zero until the lasing threshold is reached at around 100 mA. PCE then increases, quickly at first, and then more slowly with drive current until drive current reaches approximately 500 mA, where the output power is approximately 400 mW. Then, PCE slowly decreases with additional increases in drive current. Therefore, as illustrated, there is an optimum operating current range for achieving an optimum PCE or PCE range. The optimum output power and corresponding drive current typically depend upon the size of the VCSEL and the number of VCSELs in the array. As may be appreciated from FIG. 9B, in this example, an optimum PCE generally falls within the drive current range between 400 and 750 mA, which corresponds to an output power ranging from approximately 250 to 600 mW.

In certain applications, it may be desirable to scale the output power of the array to, for instance but not limited to, minimize power consumption. For example, in a sensor, more power might be needed when measuring something at long distance than needed when measuring something close up. While one can scale the power by adjusting the drive current, as shown, it would generally be at the expense of PCE.

According to one embodiment of the present disclosure, an efficient, scalable VCSEL array 1000 may be made by segmenting the VCSEL array into smaller segments 1002, each with one or more VCSEL devices or apertures 1004, and activating the number of segments desired or required for hitting the desired or optimum power and efficiency. FIG. 10A is an illustration of one configuration for a segmented array 1000. The embodiments of the present disclosure are not, however, limited to the number of total VCSELs 1004 shown, the number of segments 1002 shown, the number of VCSELs per segment, or the orientation and configuration of any given segment. FIG. 10A provides just an example configuration for a segmented array 1000 for ease of discussion.

As shown in FIG. 10A, in each segment 1000, several VCSEL devices/apertures 1004 may each be connected with a common metal or other conductive contact 1006. For ease of discussion, in FIG. 10A, each segment 1002 is labeled with a letter on the bond pad area for that segment (i.e., the area where a metal wire can be bonded to the metal or conductive contact 1006 for that segment). In some embodiments, the different segments 1002 may be purposefully designed to be approximately centered around the same spot on the chip. This can be advantageous, for example, where it is desired to combine the VCSEL array 1000 with a lens or other optical element, so that the impact of the optical element will be relatively independent of the number of segments 1002 activated. In some embodiments, a lens could be sized to be substantially larger than the size of the VCSEL array 1000, so that most of the array would be located close to the lens center.

According to an embodiment of the present disclosure, the segments 1002 may be activated individually or in combination with other segments to hit the desired or optimum power and efficiency for the current application. For example, in one embodiment, at the lowest desired output power, Segment A may be individually electrically activated first, by driving a current through all of the VCSELs 1004 in Segment A in parallel. VCSELs in the other segments may not yet be electrically activated. As the desired output power for an application increases, Segment B may be individually electrically activated next, while the other segments (including Segment A) remain or are switched off. For even further output power, both Segments A and B may be electrically activated in combination. For still more output power, Segments A, B, and C (or a subcombination of Segments A and C or Segments B and C) may be electrically activated in combination. For yet more output power, Segments A, B, C, and D (or another subcombination of Segments A, B, C, and D that includes more VCSELs 1004 than the combination of Segments A, B, and C) may be electrically activated in combination. In this example configuration, activating Segments A, B, C, and D in combination may provide for the maximum output power for this chip. As indicated above, however, the embodiments of the present disclosure are not limited to the number of total VCSELs 1004 shown in FIG. 10A, the number of segments 1002 shown in FIG. 10A, the number of VCSELs per segment, or the orientation and configuration of any given segment. The order in which segments 1002 of any given embodiment are activated and the combinations of segments activated may depend, at least in part, on the above characteristics as well as the desired effect for a given application.

In still other embodiments, an electrical contact 1006 and bond pad could be provided for any combination of VCSELs 1004, up to an electrical contact and bond pad for each VCSEL in the array 1000. However, while one could provide up to a separate electrical contact 1006 and bond pad for each VCSEL 1004 in the array 1000, there can be disadvantages as the number of VCSELS for each electrical contact and bond pad decrease nearer to a few VCSELS or less. For example, the real estate on the chip required for all of the bond pads and metal traces to contact each VCSEL or small VCSEL group would be quite extensive, and thus the chip size and associated cost would likely increase. Also, there would be increased complexity in providing a driver that generates a separate signal for each VCSEL or small VCSEL group. Nonetheless, embodiments including one or more segments 1002 having a single VCSEL 1004 or having a relatively small number of VCSELS that may each be individually electrically activated to form various combinations of desired output power are within the scope of the present disclosure.

Figure 10B:
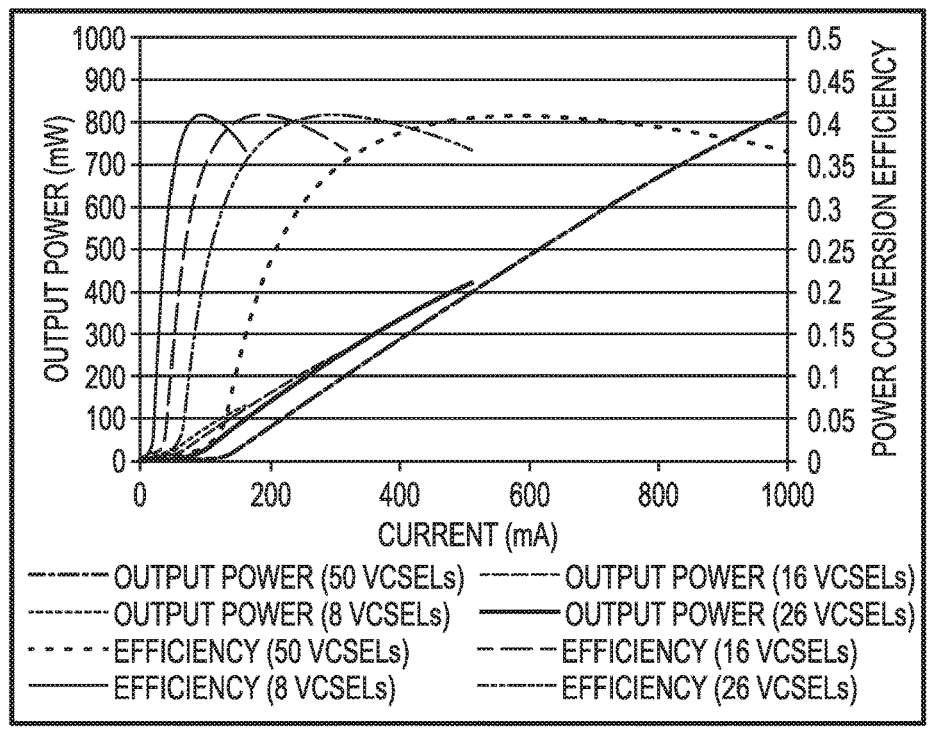
FIG. 10B is a graph of the output power versus drive current, and the associated PCE for four different VCSEL array sizes—8, 16, 24, and 50.

FIG. 10B shows the output power versus drive current, and the associated PCE for four different example VCSEL array sizes—8, 16, 24, and 50. The example VCSEL array sizes of 8, 16, 24, and 50 correspond to Segment A of FIG. 10A activated alone, Segment B of FIG. 10A activated alone, Segments A and B of FIG. 10A activated in combination, and Segments A, B, and C of FIG. 10A activated in combination, respectively. As may be appreciated from FIG. 10B, for each size of activated array, the PCE rises rather quickly after the lasing threshold is reached, reaches a peak, and then drops relatively slowly with increasing drive current and output power. A maximum PCE is reached at different drive currents and output powers for each of the different sized arrays.

Figure 10C:
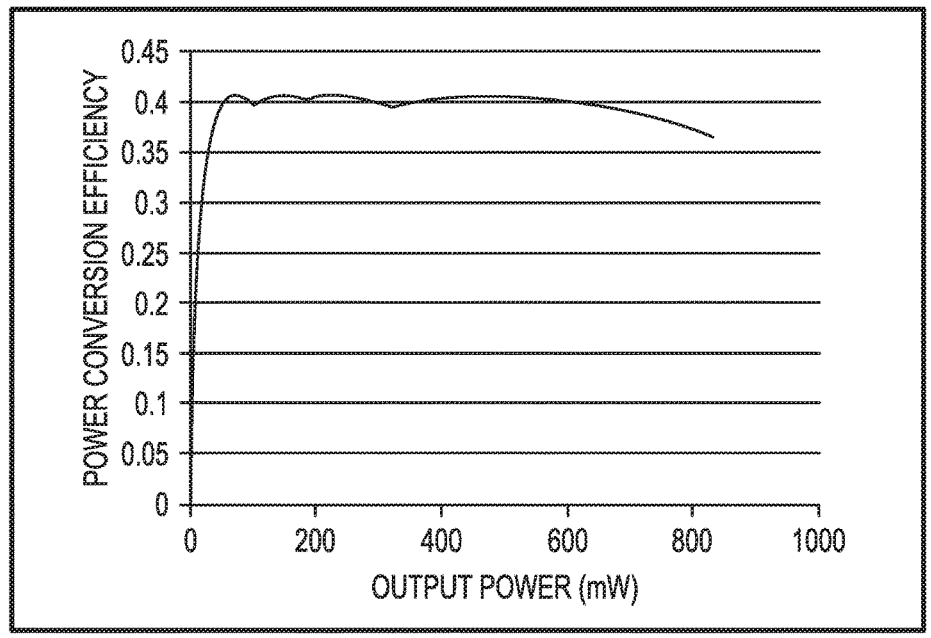
FIG. 10C is a graph of the PCE versus drive current for a segmented VCSEL array, according to one embodiment of the present disclosure.

If a conventional array of only one array size was used, an expected power output range would have to first be selected in order to design for optimized PCE. In contrast, combining different array segments onto a single chip and activating various of the different segments as the desired output power increases, as described herein, can result in a high efficiency over a broad range of power levels. Such is illustrated, for example, by FIG. 10C with regard to the example embodiment illustrated in FIG. 10A. By operating Segment A alone until the desired output power reaches approximately 100 mW, then operating Segment B alone from approximately 100 to 185 mW output power, and then combined Segments A and B from approximately 185 mW to 320 mW output power, and then combined Segments A, B, and C for output power above approximately 320 mW, for example, a PCE of generally around 40% may be maintained for output powers ranging from down around 50 mW to over 600 mW.

For illumination sources and sensors incorporated into mobile consumer devices, for example, this approach may allow the designer of the device to optimize power consumption of the illumination source or sensor. For example, for sensing of objects that are a short distance away, Segment A can be activated, while for objects at a much further distance, up to all segments of the array may be activated.

Figure 11A:
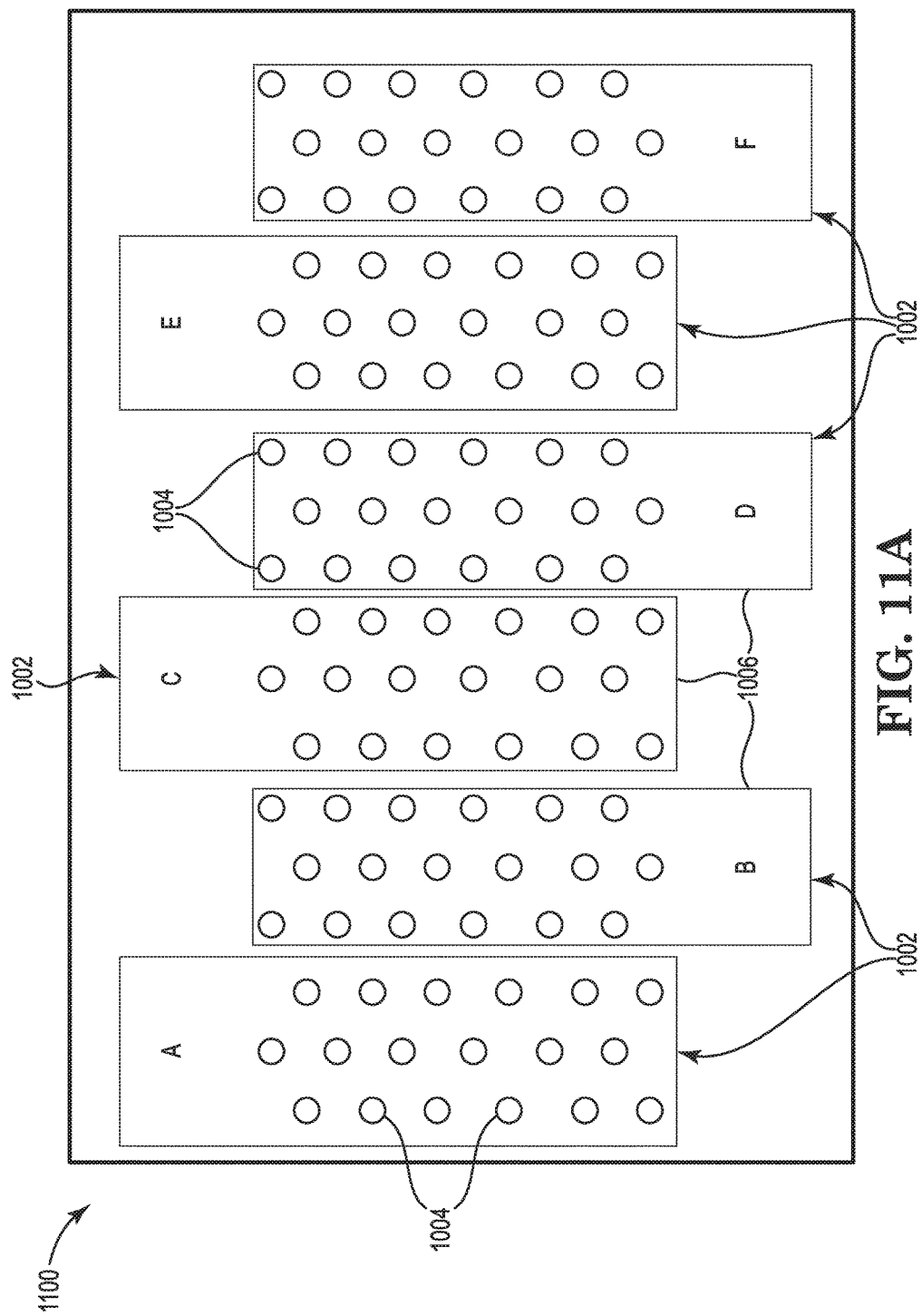
FIG. 11A is a schematic of a segmented VCSEL array, according to another embodiment of the present disclosure.

As indicated above, in some embodiments, the different VCSEL segments of a VCSEL array may be purposefully designed to be approximately centered around the same spot on the chip. This can be advantageous, for example, where it is desired to combine the VCSEL array with a lens or other optical element. However, another embodiment may include creating VCSEL segments that are not centered around a point. FIG. 11A illustrates an example configuration 1100 of such an embodiment. Again, the embodiments of the present disclosure are not limited to the number of total VCSELs 1004 shown in FIG. 11A, the number of segments 1002 shown in FIG. 11A, the number of VCSELs per segment, or the orientation and configuration of any given segment. Also, the order in which segments of any given embodiment are activated and the combinations of segments activated may depend, at least in part, on the above characteristics as well as the desired effect for a given application. Like with FIG. 10A, for ease of discussion, in FIG. 11A, each segment 1002 is labeled with a letter on the bond pad area for that segment.

Figure 11C:
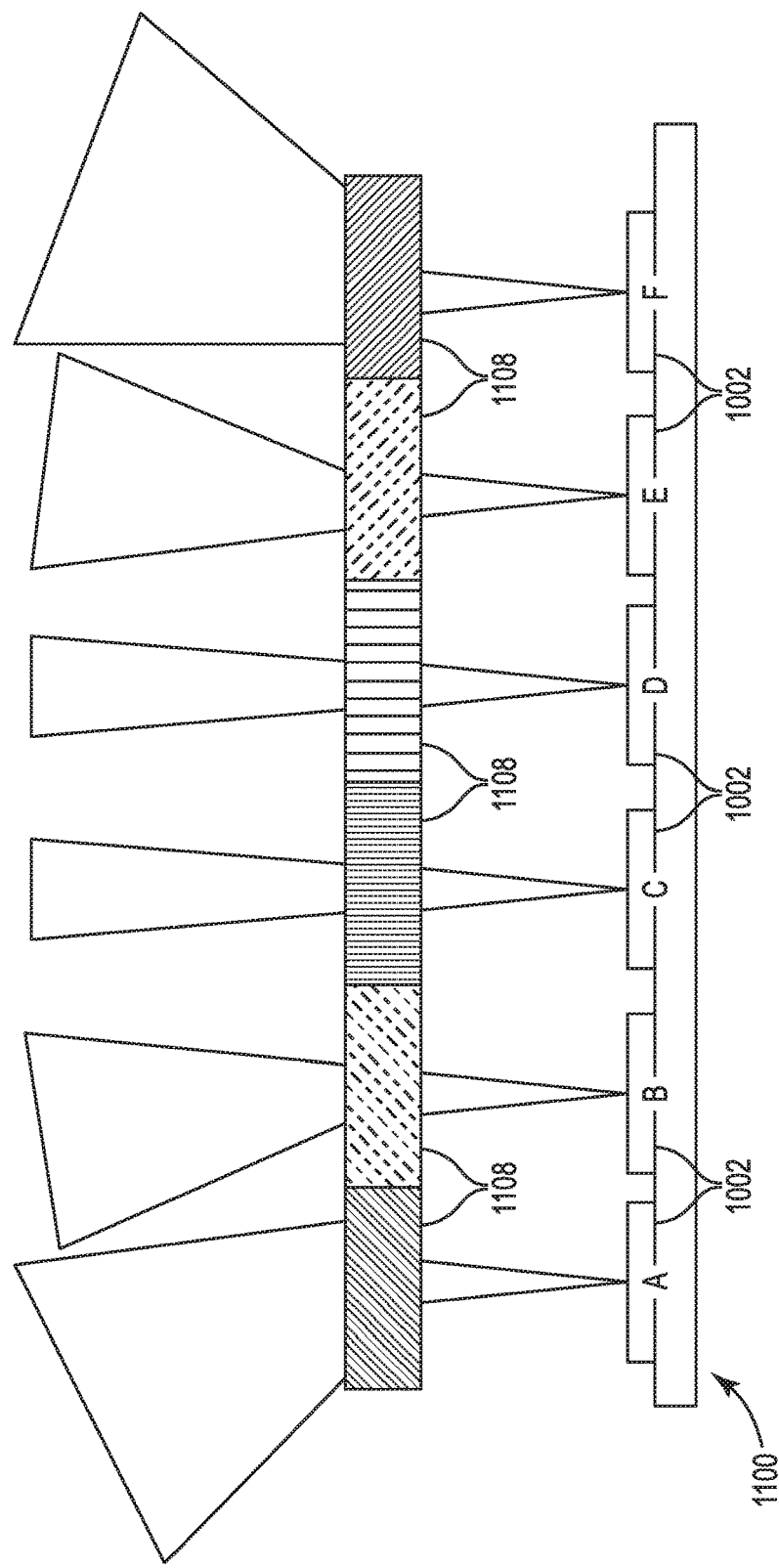
FIG. 11C is a schematic of a segmented VCSEL array in combination with a lens or other optical element, according to another embodiment of the present disclosure.

If an embodiment of FIG. 11A is also used with an optical element, such as but not limited to, a lens, then optical beams from one or more of the different segments 1002 of the VCSEL array 1100 may each be directed or redirected to a specific, and in some cases different, angle depending upon the alignment of the segment to the lens (or other optical element). Such is illustrated schematically in FIG. 11B, where the emitted light 1102 from each Segment A-F is individually directed toward a same focal point 1104 via a lens (or other optical element) 1106. The lens (or other optical element) 1106 could be of approximately similar size to the overall VCSEL array 1100. Different segments 1002 of the VCSEL array 1100 may pass through different parts of the lens (or other optical element) 1106. Off-axis illumination may be bent to travel in different directions. In some embodiments, such as illustrated schematically in FIG. 11C, the optical element 1106 could alternatively or additionally be a diffractive optical element (DOE), with different areas 1108 of the DOE associated with the various segments 1002 of the array 1100. The different areas 1108 of the DOE may perform different functions for each of one or more of the array segments 1002, such as dispersion of the light beam to a larger angle, focusing, and/or turning of the beam.

By choosing to activate one or more VCSEL array segments, in some embodiments, the array can be used to target illumination to a particular area of interest, thus saving power. Alternatively or additionally, the segments of the VCSEL array could be cycled through sequentially, such that an entire area can be illuminated but the amount of current drawn or light emitted at any given point in time can be limited. This can both reduce power consumption, as well as help improve eye safety. Still another alternative or additional way of operating a segmented VCSEL array together with a lens or segmented optical element can include controlling the drive current through each segment so as to increase or optimize the power distribution across the illuminated area. For example, usually intensity drops off at the higher beam angles, but this could be compensated for by increasing the current through the segments directed toward the higher angles.

Although not limited to the following, unique features of the foregoing embodiments of the present disclosure include: a VCSEL array divided into segments, where each segment can be addressed and activated individually in order to, for example, scale the total power from the array; selecting the number of VCSELs in each segment so that a nearly or substantially constant range of high efficiency can be maintained over a broad range of output powers; designing the array such that the number of VCSELs in at least one segment is approximately or around double the number (e.g., not necessarily exactly double, but tends to have generally or substantially the same effect as if double) of VCSELs in another segment; arranging the segments of a VCSEL array so that as segments are activated, the center of the activated array remains generally or substantially centered around the same point on the VCSEL die; a VCSEL array with segments generally or substantially centered around the same point on the VCSEL die aligned to an optical element, such as but not limited to, a lens, which is sufficiently large relative to the VCSEL array so that the direction of the emitted light beam from the VCSEL array remains approximately the same regardless of how many segments in the array are activated; a VCSEL array divided into segments that can be addressed and activated individually, and the segments are arranged with respect to an optical element in order to direct the light from the VCSEL array according to selective activation of the appropriate segment (s); VCSEL array segments arranged so that the light from two or more segments passes through different parts of a lens from one another; moreover, light passing through the center of the lens is directed in a first direction (such as a forward direction), while light passing through the side of the lens is directed in a second direction (e.g., redirected at an angle off the axis of the lens); VCSEL array segments arranged so that the light from each segment passes through a grating or a diffractive optical element; moreover, the grating or optical element may be patterned with segments that correspond to the VCSEL segments; still further, the segments of the gratings or optical elements can be designed and/or used to selectively direct the beams to illuminate different areas of a scene or environment; also, the segments of the gratings or optical elements can be designed and/or used to selectively focus or expand the angle of the light emitted from each VCSEL segment; VCSEL segments combined with lenses, gratings, or diffractive optical elements and activated sequentially, in order to sequentially illuminate different areas of a scene or environment.

Design of Array to Improve Speckle

A potential disadvantage of using a laser as an illumination source is the speckle that arises from the coherence of the laser. When coherent light is reflected from a diffused surface, it is as though each point of the surface is emitting a light wave. Generally, all of the reflected light waves have the same frequency, but the phase and amplitude of the light reflected from different parts of the surface will vary. The light will interfere constructively and destructively producing a pattern of light and dark spots that appears random. When further attempting to form an image from the reflected light, the speckle effect adds noise to the image.

A method for reducing speckle can include incorporating a diffuser that moves or vibrates into the path of the laser beam. Alternatively, the current drive to the laser may be modulated in order to slightly change the wavelength so that, integrated over time, the coherence can be reduced.

According to embodiments of the present disclosure, the use of a VCSEL array can also help reduce speckle effect. Although each VCSEL in the array is coherent, the individual VCSELs are not coherent with each other. If the optical light emission of the VCSELs overlap in the far field, or otherwise at the location(s) the laser device is trying to illuminate, then the speckle contrast of a single source is reduced by the square root of the number of sources in the array which are allowed to overlap. In other words:

$$\text{Speckle contrast (array)} = \frac{\text{Speckle contrast of individual laser}}{\sqrt{N}}$$

where Speckle contrast (array) is the speckle contrast for the VCSEL array and N is the number of VCSEL sources in the array. For example, the speckle contrast of a VCSEL array with thirty-six (36) emitters will be reduced by a factor of six (6) as compared to the contrast from a single VCSEL.

Figure 12A:
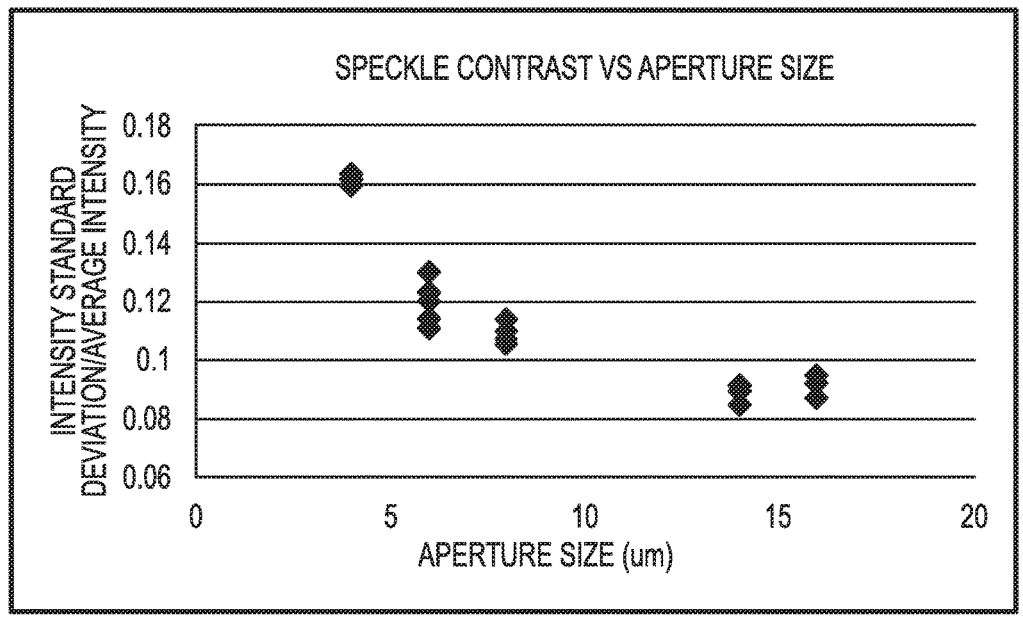
FIG. 12A is a graph of speckle contrast versus VCSEL aperture size.

The foregoing equation also indicates that the speckle contrast is a function of speckle contrast of the individual laser. A further design consideration in a VCSEL array is, thus, the aperture size of each individual VCSEL and its effect on speckle. For purposes of the present disclosure, speckle for various VCSEL sizes was quantified by shining the light from a single VCSEL onto a diffusive surface and capturing the image on a charge-coupled device (CCD) array. The maximum and minimum intensities in the image were measured. The speckle contrast was defined as the standard deviation of the intensity variation in the speckle pattern, divided by the mean intensity. The speckle contrast was measured for VCSELs having example aperture diameters of 4, 6, 8, 14, and 16 microns, and a plot of speckle contrast for each of the four sizes is illustrated in FIG. 12A. As may be appreciated, the larger diameter VCSELs are less coherent and therefore have a lower speckle contrast. Nonetheless, the contrast of all sizes of VCSEL can be reduced by creating an array. However, for arrays having the same number of emitters for each VCSEL array size, the arrays with larger diameter VCSELs will result in a corresponding lower speckle contrast. For instance, the speckle contrast of a 4 µm aperture diameter VCSEL is generally twice as large as that for a 14-16 µm aperture diameter VCSEL. Thus, for the same number of VCSEL apertures in an array, this factor of two will persist, i.e., the speckle contrast of a 25 element array of 4 µm aperture diameter VCSELs will be around twice as large as for a 25 element array of 14-16 µm aperture diameter VCSELs.

Figure 12B:
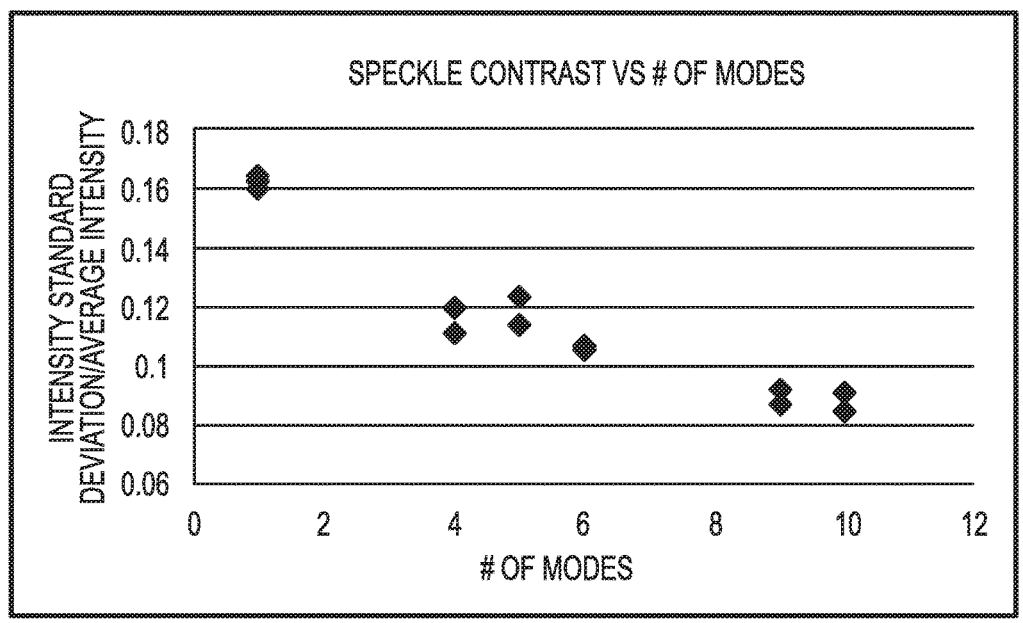
FIG. 12B is a graph of speckle contrast versus number of VCSELs modes.
Figure 12C:
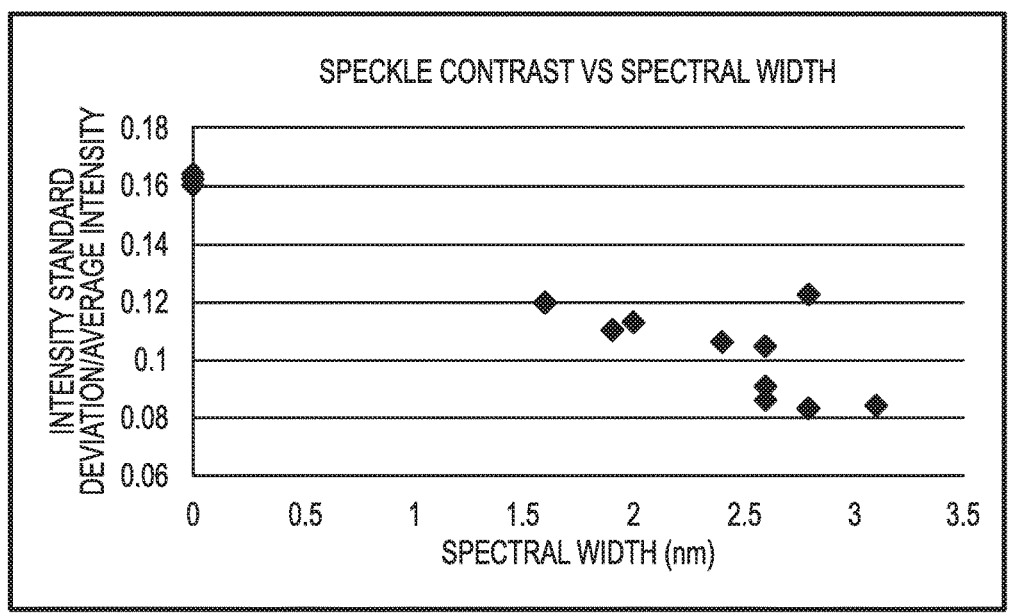
FIG. 12C is a graph of speckle contrast versus spectral width of a VCSEL.
Figure 13A:
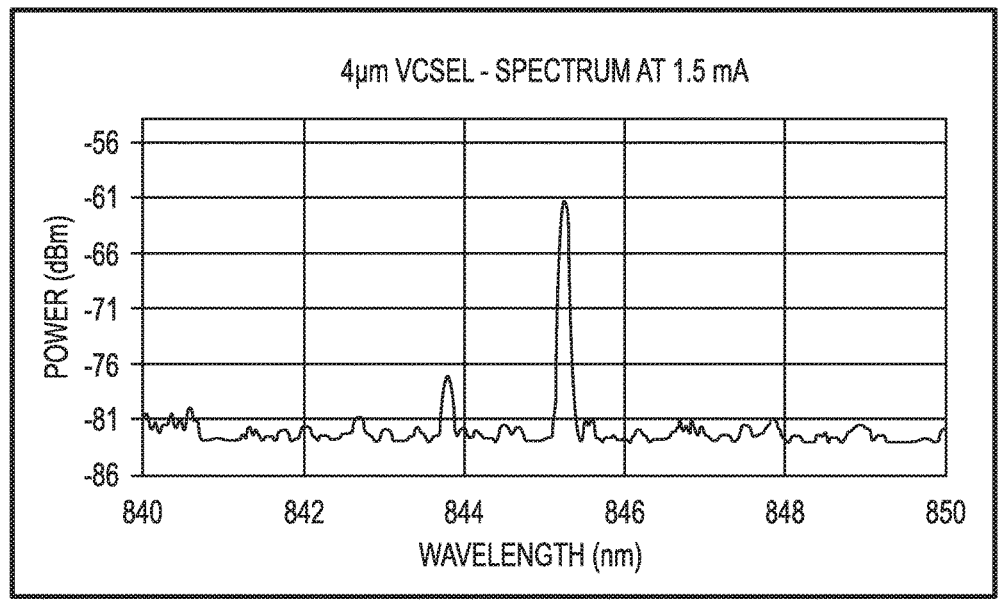
FIG. 13A is a graph of the spectrum for a VCSEL with aperture size of 4 microns.
Figure 13B:
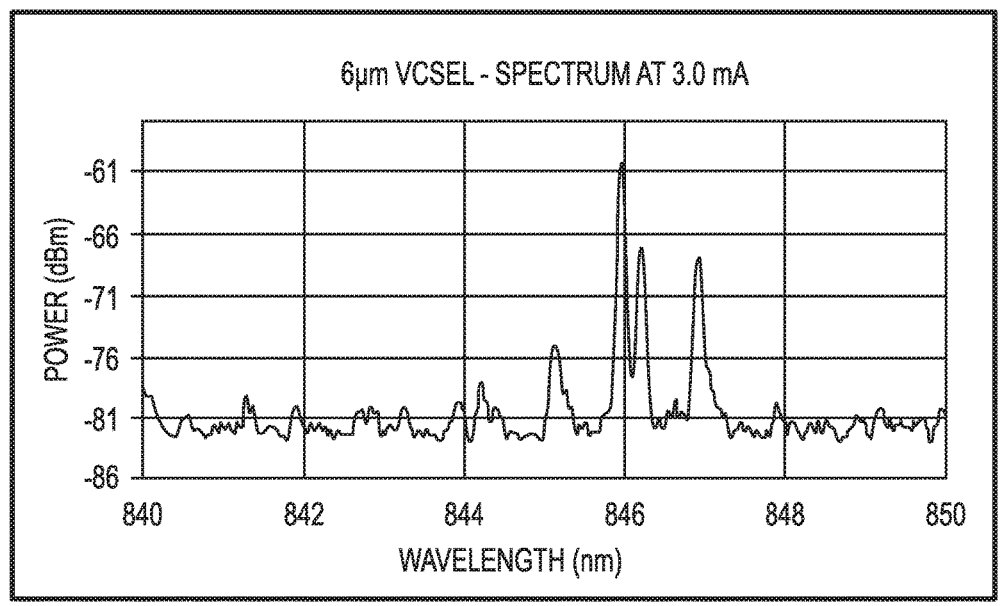
FIG. 13B is a graph of the spectrum for a VCSEL with aperture size of 6 microns.
Figure 13C:
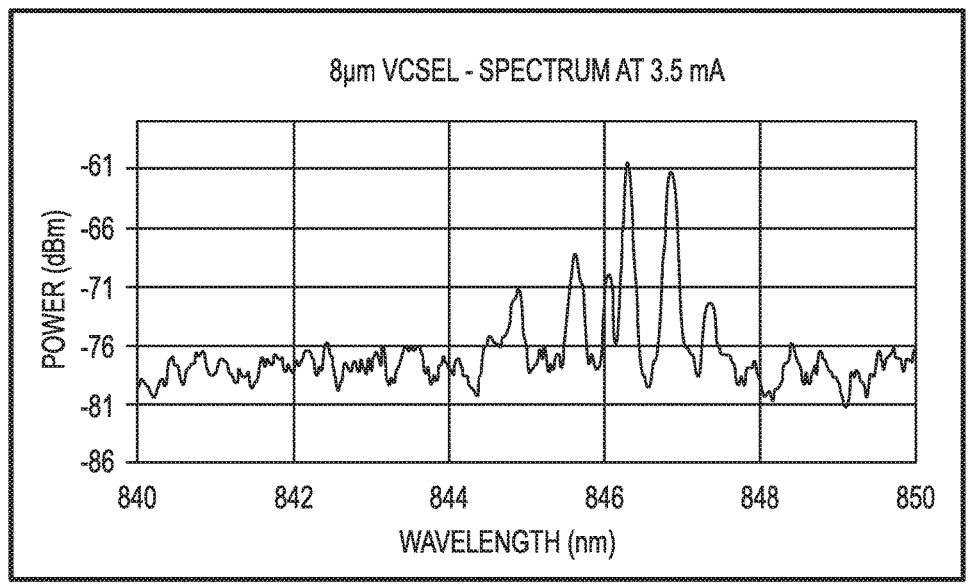
FIG. 13C is a graph of the spectrum for a VCSEL with aperture size of 8 microns.
Figure 13D:
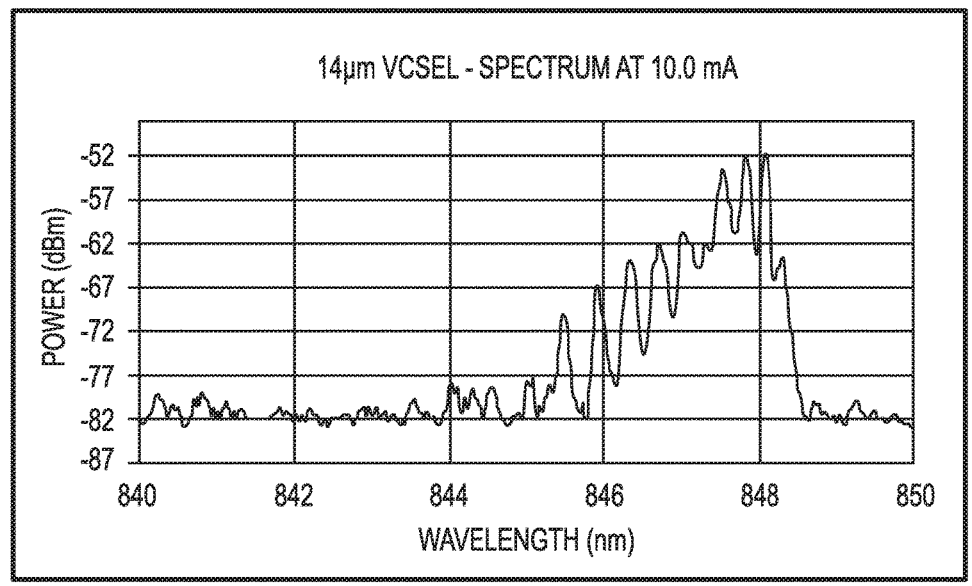
FIG. 13D is a graph of the spectrum for a VCSEL with aperture size of 14 microns.

Speckle contrast can also be evaluated as a function of the number of modes visible in the spectrum (see FIG. 12B) or the spectral width of the spectrum (see FIG. 12C). The spectrum for the tested VCSELs with example aperture sizes of 4, 6, 8, and 14 microns are shown in FIGS. 13A-D, respectively. The measurement was made at the typical operating condition for each aperture size. As may be appreciated, as the aperture size increases, both the number of modes (seen as peaks in the plots in FIGS. 13A-D) and the spectral width (in nanometers) increases. These two parameters also correlate with the speckle contrast, i.e., the speckle contrast is reduced with a higher number of modes and a larger spectral width.

Thus, according to the present disclosure, speckle contrast can be reduced by using, for the laser device, an array of VCSELs in which each VCSEL has more than two modes, and the optical emission from all of the VCSELs in the array overlaps in the far field, or otherwise at the location(s) the laser device is trying to illuminate. Likewise, speckle contrast for a laser device can be reduced by using, for the laser device, an array of VCSELs in which the aperture diameter of each VCSEL is more than 6 µm, preferably more than 8 µm, or more preferably more than 10 µm, and the optical emission from all of the VCSELs in the array overlaps in the far field, or otherwise at the location(s) the laser device is trying to illuminate. Still further, speckle contrast for a laser device can be reduced by using, for the laser device, an array of VCSELs in which the spectral width of each VCSEL is greater than 0.5 nm, preferably more than 1 nm, or more preferably more than 1.5 nm, and the optical emission from all of the VCSELs in the array overlap in the far field, or otherwise at the location(s) the laser device is trying to illuminate. In the manner described herein, the advantage typically associated with LEDs of producing reduced speckle can nonetheless be achieved with VCSELS, so as to also obtain the advantage of a narrow spectrum typically associated with a laser.

Design of Array to Improve Yield and Thermal Conductivity

Figure 1:
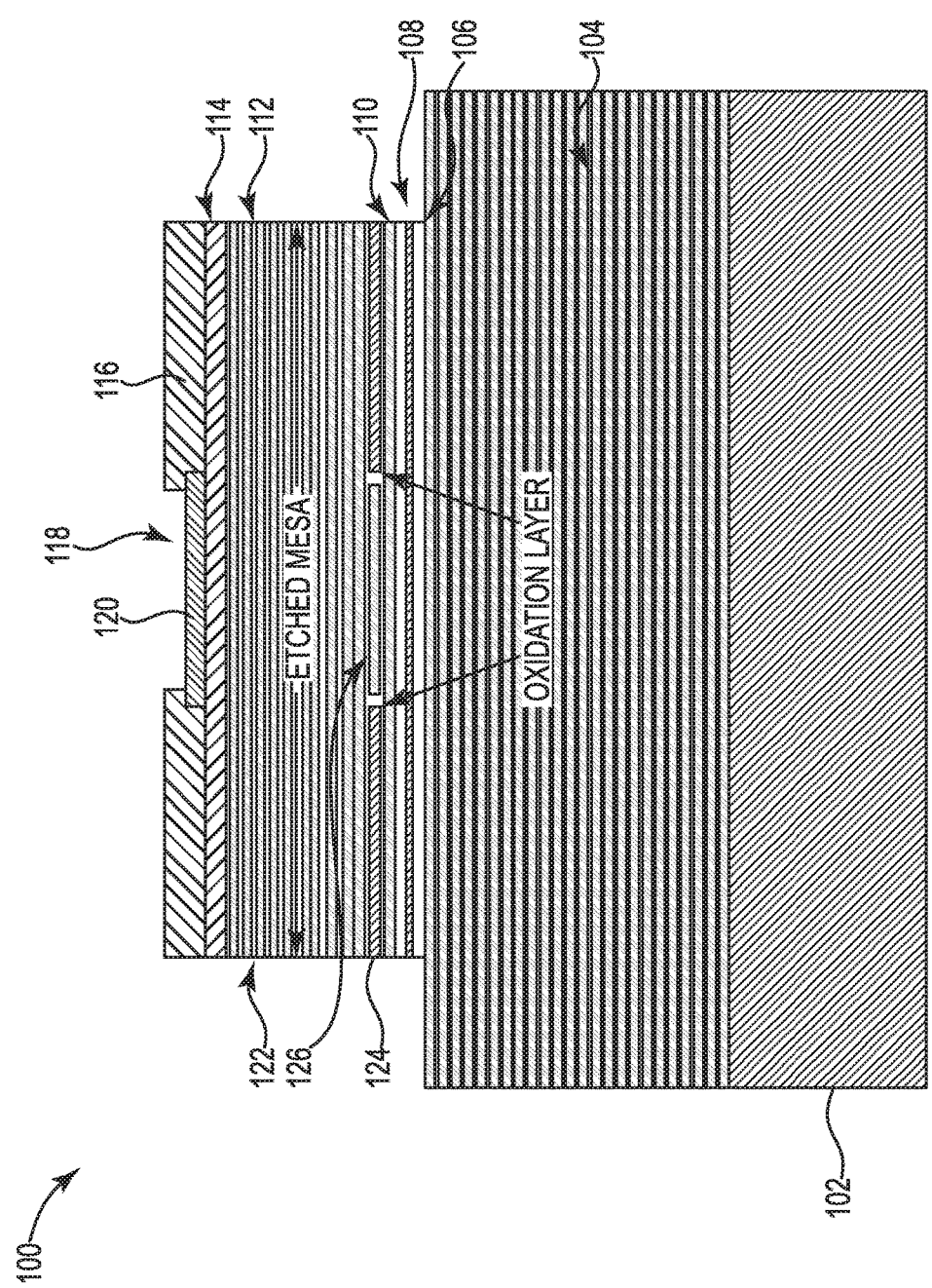
FIG. 1 is a schematic diagram of the cross-section of a conventional VCSEL.
Figure 2:
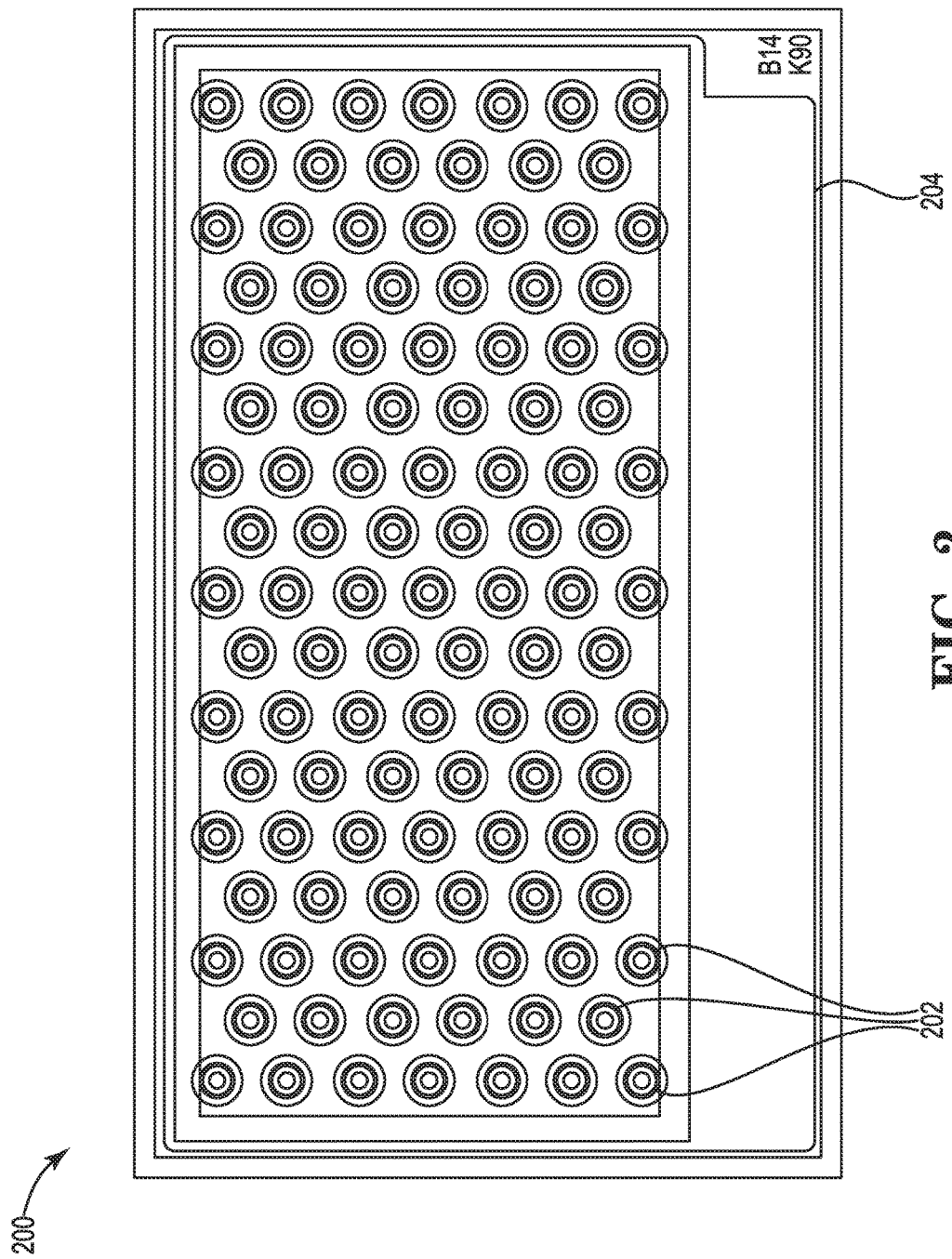
FIG. 2 is an example schematic layout for a VCSEL array chip with, for example, 111 VCSEL apertures.
Figure 3A:
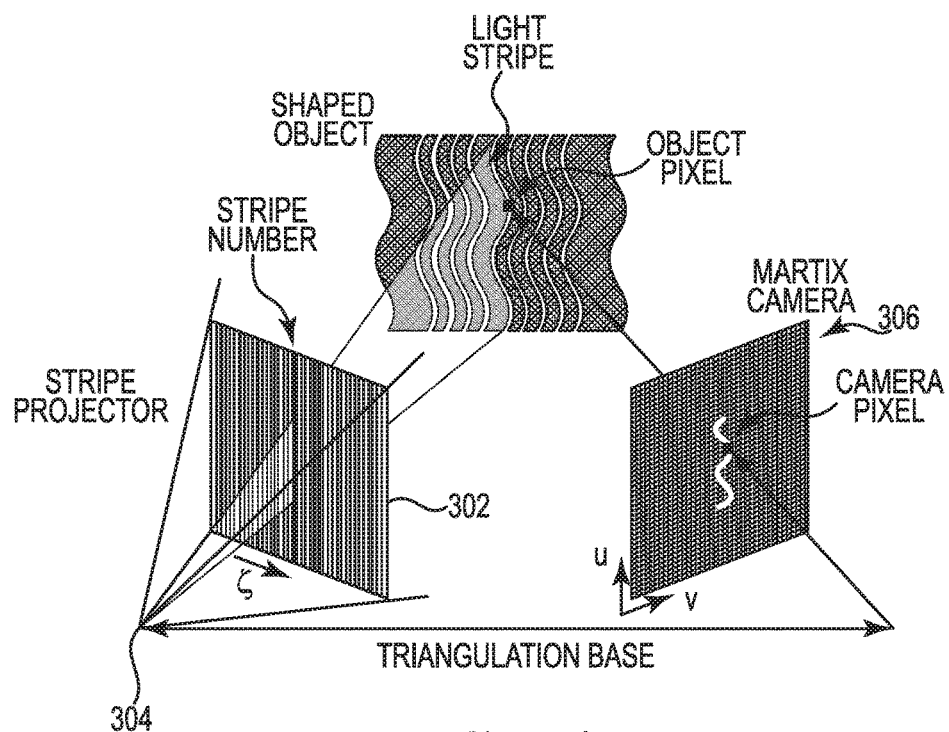
FIG. 3A is a diagram illustrating a structured lighting sensing mechanism.
Figure 3B:
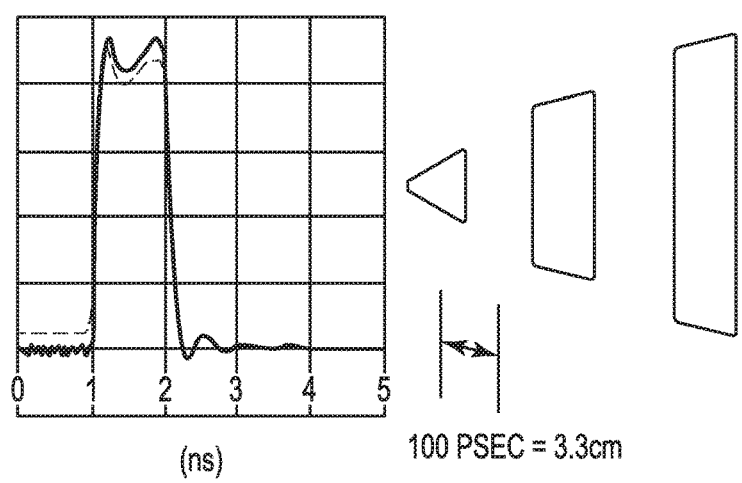
FIG. 3B is a diagram illustrating a time-of-flight sensing mechanism.
Figure 3C:
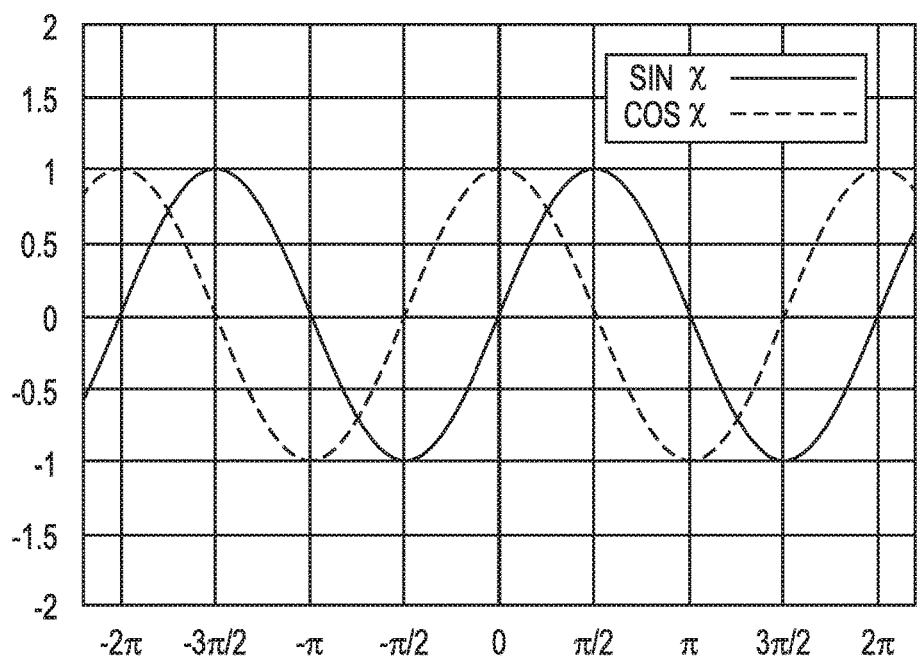
FIG. 3C is a diagram illustrating a modulated phase shift sensing mechanism.

As mentioned previously and referenced with respect to FIG. 1, efficient operation of a VCSEL often requires a means for providing confinement of the current to the middle of the VCSEL device where there is an opening in the contacting metal. FIG. 1 illustrates use of an oxidation layer 124 to provide this current confinement. Such an oxide layer is typically created by growing a layer or layers in the epitaxial structure of the VCSEL that contain more aluminum than all of the other layers in the epitaxial structure. A mesa structure 122 may be etched that generally extends to or below the layer or layers 124 with increased aluminum. A plan view schematic of a standard mesa structure 1402 is illustrated on the right hand side of FIG. 14A. When a wafer with the VCSEL structure is placed into a high temperature atmosphere in the presence of steam, the high aluminum containing layer(s), which is now exposed on the sidewall of the formed mesa structure, will convert from AlAs or AlGaAs to an aluminum oxide layer 124. While the original AlAs or AlGaAs layer is electrically conductive, the aluminum oxide layer is electrically insulating. However, an unoxidized region 126 is left generally in the middle of the mesa structure 122, aligned with the opening 118 in the metal contact 116, so that current can flow through the middle of the VCSEL device.

Figure 14A:
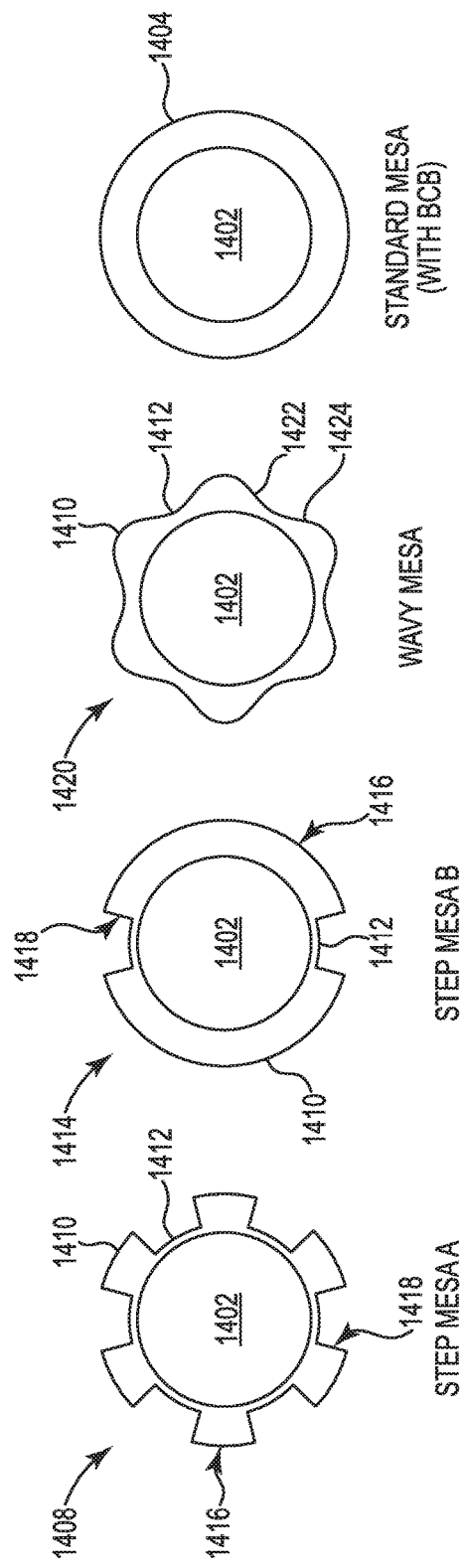
FIG. 14A illustrates trench designs for an etched mesa of a VCSEL.
Figure 14B:
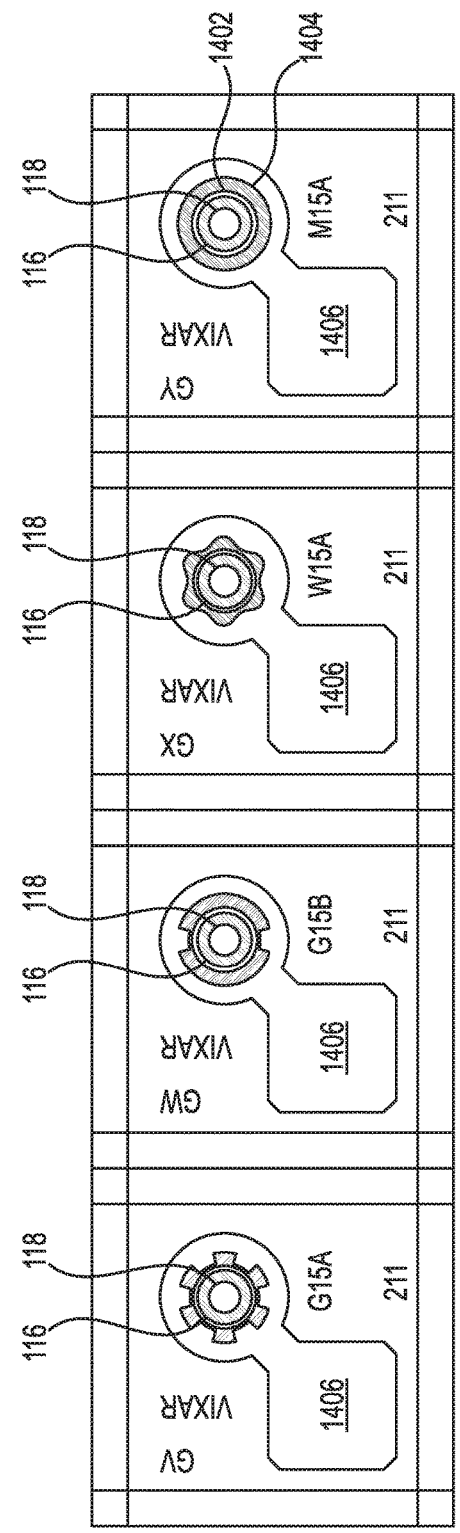
FIG. 14B illustrates a complete layout of a VCSEL for each corresponding trench design of FIG. 14A, including the metal or other conductive material that is deposited to form a ring contact around the VCSEL as well as a bond pad for attaching a wire for connecting to the package.

In forming a mesa structure, while everywhere outside the mesa structure, shown for example in FIG. 1, could be etched, it may be desirable and beneficial to etch various structures around the mesa, particularly in the case of VCSEL arrays. For example, maintaining generally as planar a wafer surface as possible is typically desirable in order to improve manufacturing yield. It is also desirable to maintain good thermal conductivity by having semiconductor material in close proximity in order to conduct away the thermal heat generated in the VCSEL. Therefore, instead of an isolated mesa structure 1402, a trench ring 1404 is typically etched around each VCSEL that may be several microns wide. This conventional structure is schematically shown in plan views on the right hand sides of FIGS. 14A-B, where FIG. 14A shows a top plan conceptual illustration of the ring 1404 that is etched generally to or below the layer(s) 124 with increased aluminum, and FIG. 14B shows a complete plan layout of the VCSEL, including the metal or other conductive material 1406 that is deposited to form a ring contact around the VCSEL as well as a bond pad for attaching a wire for connecting to the package. The trench ring 1404 may be filled with a dielectric or polymeric material, such as but not limited to benzocyclobutene (BCB), so that the metal deposited around the VCSEL can cross over the trench with good metal continuity. In some cases, without this filler to the trench, the deposited metal might not otherwise provide good step coverage from the top of the VCSEL, down into the trench, and up the other wall to connect to the wire bond.

Other mesa etch designs for this trench around the mesa could, however, be used to reduce the need for the trench filler material and also improve the thermal conductivity by reducing the width of the trench. Typically, the radial width of the standard uniform trench ring 1404 illustrated on the right hand side of FIG. 14A is around 3-20 microns. Since the etch rate for the trench 1404 depends somewhat upon its radial width, the width of the trench is usually designed to ensure a reproducible etch depth to ensure that the trench is deep enough to reach down to or pass the oxidation layer(s) 124 (i.e., the layer(s) with increased aluminum). A uniform narrower trench alone, however, could preclude a consistent etch depth, which could result in VCSELs not having the appropriate oxide confinement layer 124.

FIG. 14A illustrates three alternatives to the standard uniform ring 1404 (i.e., the right hand side of FIG. 14A) for the trench around, and forming, the mesa—a Step Mesa A, a Step Mesa B, and a Wavy Mesa. In contrast to a standard uniform ring 1404 around the mesa, these alternative designs of FIG. 14A generally combine the relatively wide trench feature of the standard uniform ring, ensuring a reproducible oxidation process, with areas around the mesa where the etched gap can be as narrow as 0.5-3 microns, preferably between 0.5-2 microns. The relatively wider part(s) of the trench ensure a reproducible depth to the trench, while the relatively narrower part(s) of the trench allow the metal or other conductive material that is deposited to form a ring contact around the VCSEL to better fill the trench in these areas, providing a crossing point for the metal without the need for a polymer or dielectric etch filler, and also providing a better thermal connection to the surrounding wafer.

The Step Mesa A design 1408 illustrated in FIG. 14A generally illustrates an example embodiment where several relatively wide trench regions 1410, of generally the same radial and circumferential width and shape, are separated by several relatively narrow trench regions 1412, also of generally the same radial and circumferential width and shape. While six wide trench regions 1410 and six narrow trench regions 1412 are shown, in other embodiments, any suitable number of wide and narrow trench regions may be utilized. Moreover, the wide trench regions 1410 need not be of generally the same radial and circumferential width and shape as one another, and the narrow trench regions 1412 need not be of generally the same radial and circumferential width and shape as one another. Still further, in the embodiment shown, the wide regions 1410 in combination circumferentially surround about an equivalent portion of the mesa 1402 as do the narrow regions 1412 in combination. However, in other embodiments, the wide regions 1410 may circumferentially surround more or less of the mesa 1402 than the narrow regions 1412. In one embodiment, the wide trench regions 1410 are each between about 3-20 microns wide radially and the narrow trench regions 1412 each can be as narrow as about 0.5-3 microns wide radially, preferably between about 0.5-2 microns wide radially. The Step Mesa B design 1414 illustrated in FIG. 14A is an example subcase of the Step Mesa A design 1408. In the Step Mesa B design 1414, there are only two wide regions 1410 and two narrow regions 1412. In the embodiment shown, the wide regions 1410 circumferentially surround a larger portion of the mesa 1402 than do the narrow regions 1412. However, in other embodiments, the wide regions 1410 may circumferentially surround the same amount or less of the mesa 1402 than do the narrow regions 1412. In both the Step Mesa A 1408 and Step Mesa B 1414 designs and some variations thereof, the exterior wall 1416 of the trenches may curve about a central axis of the mesa 1402 and the side walls 1418 extending or transitioning between the wide 1410 and narrow 1412 trenches may lie along radial paths extending from the central axis of the mesa. However, such is not required in every embodiment. For example, the Wavy Mesa design 1420 illustrated in FIG. 14A is an example of one embodiment of a trench where there is a more gradual transition between the wide 1410 and narrow 1412 regions of the trench. That is, traveling clockwise around the trench, in areas between the widest 1410 and narrowest 1412 trench regions, the trenches gradually narrow 1422 and in areas between the narrowest and widest trench regions, the trenches gradually widen 1424. In such embodiments, there may be no abrupt side walls 1418 that lie along radial paths extending from the central axis of the mesa 1402. While six wider trench regions 1410 and six narrower trench regions 1412 are shown, in other embodiments, any suitable number of wide and narrow trench regions may be utilized. Additionally, any transition between a wide trench to a narrow trench or vice versa, may be sloped more or less (e.g., the width may transition more quickly or more slowly) than that illustrated in the Wavy Mesa design 1420 shown in FIG. 14A. FIG. 14B illustrates corresponding plan layouts of the VCSEL for the example alternative mesa trench designs, including the metal or other conductive material 1406 that is deposited to form a ring contact around the VCSEL as well as a bond pad for attaching a wire for connecting to the package.

To be clear, while specific shapes for the trench etched around, and forming, a mesa are illustrated in FIG. 14 as alternatives to a standard uniform mesa etch 1404 (i.e., the right hand side of FIG. 14A), the various embodiments of the present disclosure are not limited to the three example trench shapes illustrated. Instead, the scope of the present disclosure includes any etched trench for a mesa that includes at least one relatively larger trench width (in the radial direction) circumferentially positioned around the mesa 1402 and at least one relatively smaller trench width (in the radial direction) circumferentially positioned around the mesa. The relatively wider and narrower regions of the trench may or may not be equally spaced circumferentially around the mesa 1402. Moreover, any relatively wider region of the trench can be the same radial or circumferential width or different radial or circumferential width from any other relatively wider region. Likewise, any relatively narrower region of the trench can be the same radial or circumferential width or different radial or circumferential width from any other relatively narrower region. VCSELs with the designs described above and/or illustrated in FIG. 14A may be fabricated without the use of a planarizing filler material, such as BCB, and good metal continuity across the trench can nonetheless be achieved, while still providing a good oxidation confinement of the VCSEL.

Although not limited to the following, unique features of the foregoing embodiments of the present disclosure include: a VCSEL with a layer or layers of high Al containing material in the epitaxial structure, and a trench etched around the VCSEL mesa that extends through the high Al containing layers allowing the layers to be converted to an aluminum oxide in the presence of a high temperature and steam, with the trench designed to have both radially wide (3-20 microns) regions or areas and radially narrow (0.5 to 3 microns) regions or areas; moreover, the trench may include regions with a wide trench interspersed with or alternating with regions with a narrow trench; still further, there may be a relatively gradual change between the regions with a narrow trench and regions with a wide trench.

As used herein, the terms "substantially" or "generally" refer to the complete or nearly complete extent or degree of an action, characteristic, property, state, structure, item, or result. For example, an object that is "substantially" or "generally" enclosed would mean that the object is either completely enclosed or nearly completely enclosed. The exact allowable degree of deviation from absolute completeness may in some cases depend on the specific context. However, generally speaking, the nearness of completion will be so as to have generally the same overall result as if absolute and total completion were obtained. The use of "substantially" or "generally" is equally applicable when used in a negative connotation to refer to the complete or near complete lack of an action, characteristic, property, state, structure, item, or result. For example, an element, combination, embodiment, or composition that is "substantially free of" or "generally free of" an element may still actually contain such element as long as there is generally no significant effect thereof.

In the foregoing description various embodiments of the present disclosure have been presented for the purpose of illustration and description. They are not intended to be exhaustive or to limit the invention to the precise form disclosed. Obvious modifications or variations are possible in light of the above teachings. The various embodiments were chosen and described to provide the best illustration of the principals of the disclosure and their practical application, and to enable one of ordinary skill in the art to utilize the various embodiments with various modifications as are suited to the particular use contemplated. All such modifications and variations are within the scope of the present disclosure as determined by the appended claims when interpreted in accordance with the breadth they are fairly, legally, and equitably entitled.

We claim:

1. A vertical-cavity surface-emitting laser (VCSEL) package comprising:
   a VCSEL;
   a housing, containing the VCSEL; and
   a diffuser operably attached to the housing, the diffuser configured to receive an emitted beam of light from the VCSEL and configured to produce a homogenized beam with an illumination full angle of about 90 degrees with an intensity highest in the normal direction of the homogenized beam and an intensity that gradually drops off with increasing illumination angle of the homogenized beam, thereby approximating a beam profile of a conventional LED.

2. The VCSEL package of claim 1, wherein the housing comprises a Plastic Leaded Chip Carrier (PLCC) package or a ceramic package.

3. The VCSEL package of claim 1, wherein the diffuser comprises a substantially planar diffuser sheet.

4. The VCSEL package of claim 3, wherein the diffuser comprises a glass or plastic diffuser.

5. The VCSEL package of claim 1, wherein the diffuser comprises a diffractive optical element or holographic light shaping diffuser.

6. A vertical-cavity surface-emitting laser (VCSEL) and diffuser combination comprising:
   a VCSEL mounted chip-on-board to a circuit board;
   a spacer positioned at least partially around the VCSEL; and
   a diffuser operably attached to the spacer and configured to receive an emitted beam of light from the VCSEL and produce a homogenized beam with an illumination full angle of about 90 degrees with an intensity highest in the normal direction of the homogenized beam and an intensity that gradually drops off with increasing illumination angle of the homogenized beam, thereby approximating a beam profile of a conventional LED.

7. The VCSEL and diffuser combination of claim 6, wherein the diffuser comprises a glass or plastic substantially planar diffuser sheet.

8. The VCSEL and diffuser combination of claim 6, wherein the diffuser comprises a diffractive optical element or holographic light shaping diffuser.

9. The VCSEL package of claim 1, wherein the housing comprises a TO-style package.

* * * * *